(12) United States Patent
Buttolo et al.

(10) Patent No.: US 9,337,832 B2
(45) Date of Patent: May 10, 2016

(54) PROXIMITY SWITCH AND METHOD OF ADJUSTING SENSITIVITY THEREFOR

(75) Inventors: Pietro Buttolo, Dearborn Heights, MI (US); Stuart C. Salter, White Lake, MI (US); Cornel Lewis Gardner, Romulus, MI (US); Thomas Lee Goodson, Battle Creek, MI (US); James Stewart Rankin, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 869 days.

(21) Appl. No.: 13/489,731

(22) Filed: Jun. 6, 2012

(65) Prior Publication Data

US 2013/0328616 A1 Dec. 12, 2013

(51) Int. Cl.
*H03K 17/955* (2006.01)

(52) U.S. Cl.
CPC .... *H03K 17/955* (2013.01); *H03K 2217/94026* (2013.01); *H03K 2217/960775* (2013.01)

(58) Field of Classification Search
CPC . H03K 17/975; H03K 17/945; H03K 17/955; H03K 2217/94026; H03K 2217/945
USPC .............................. 200/600; 307/9
See application file for complete search history.

(56) References Cited

U.S. PATENT DOCUMENTS

| | | | |
|---|---|---|---|
| 3,382,588 A | 5/1968 | Serrell et al. | |
| 3,544,804 A | 12/1970 | Gaumer et al. | |
| 3,691,396 A | 9/1972 | Hinrichs | |
| 3,707,671 A | 12/1972 | Morrow et al. | |
| 3,725,589 A * | 4/1973 | Golden | 379/75 |
| 3,826,979 A | 7/1974 | Steinmann | |
| 3,950,748 A * | 4/1976 | Busy | G01S 13/538 342/93 |
| 4,204,204 A | 5/1980 | Pitstick | |
| 4,205,325 A | 5/1980 | Haygood et al. | |
| 4,232,289 A | 11/1980 | Daniel | |
| 4,257,117 A | 3/1981 | Besson | |
| 4,290,052 A | 9/1981 | Eichelberger et al. | |

(Continued)

FOREIGN PATENT DOCUMENTS

DE 4024052 1/1992
EP 1152443 11/2001

(Continued)

OTHER PUBLICATIONS

U.S. Appl. No. 14/518,141, filed Oct. 20, 2014, entitled "Directional Proximity Switch Assemby," (23 pages of specification and 13 pages of drawings) and Official Filing Receipt (3 pages).

(Continued)

*Primary Examiner* — Jared Fureman
*Assistant Examiner* — Emmanuel R Dominique
(74) *Attorney, Agent, or Firm* — Vichit Chea; Price Heneveld LLP

(57) ABSTRACT

A vehicle proximity switch and method are provided having sensitivity control. The switch includes a proximity sensor, such as a capacitive sensor, installed in a vehicle and providing a sense activation field. Control circuitry processes the activation field to sense user activation of the switch by comparing the activation field to a threshold. The threshold is adjusted down when a substantially stable sensor signal is detected below the threshold for a minimum time period, and the threshold is adjusted up when a sensor signal greater than the threshold by a predetermined value is detected.

20 Claims, 11 Drawing Sheets

(56) References Cited

U.S. PATENT DOCUMENTS

| | | |
|---|---|---|
| 4,340,813 A | 7/1982 | Sauer |
| 4,374,381 A | 2/1983 | Ng et al. |
| 4,377,049 A | 3/1983 | Simon et al. |
| 4,380,040 A | 4/1983 | Posset |
| 4,413,252 A | 11/1983 | Tyler et al. |
| 4,431,882 A | 2/1984 | Frame |
| 4,446,380 A | 5/1984 | Moriya et al. |
| 4,453,112 A | 6/1984 | Sauer et al. |
| 4,492,958 A | 1/1985 | Minami |
| 4,494,105 A | 1/1985 | House |
| 4,502,726 A | 3/1985 | Adams |
| 4,514,817 A | 4/1985 | Pepper et al. |
| 4,613,802 A | 9/1986 | Kraus et al. |
| 4,680,429 A | 7/1987 | Murdock et al. |
| 4,743,895 A | 5/1988 | Alexander |
| 4,748,390 A | 5/1988 | Okushima et al. |
| 4,758,735 A | 7/1988 | Ingraham |
| 4,821,029 A | 4/1989 | Logan et al. |
| 4,855,550 A | 8/1989 | Schultz, Jr. |
| 4,872,485 A | 10/1989 | Laverty, Jr. |
| 4,899,138 A | 2/1990 | Araki et al. |
| 4,901,074 A | 2/1990 | Sinn et al. |
| 4,905,001 A | 2/1990 | Penner |
| 4,924,222 A | 5/1990 | Antikidis et al. |
| 4,972,070 A | 11/1990 | Laverty, Jr. |
| 5,025,516 A | 6/1991 | Wilson |
| 5,033,508 A | 7/1991 | Laverty, Jr. |
| 5,036,321 A | 7/1991 | Leach et al. |
| 5,050,634 A | 9/1991 | Fiechtner |
| 5,063,306 A | 11/1991 | Edwards |
| 5,108,530 A | 4/1992 | Niebling, Jr. et al. |
| 5,153,590 A | 10/1992 | Charlier |
| 5,159,159 A | 10/1992 | Asher |
| 5,159,276 A | 10/1992 | Reddy, III |
| 5,177,341 A | 1/1993 | Balderson |
| 5,212,621 A | 5/1993 | Panter |
| 5,215,811 A | 6/1993 | Reafler et al. |
| 5,239,152 A | 8/1993 | Caldwell et al. |
| 5,270,710 A | 12/1993 | Gaultier et al. |
| 5,294,889 A | 3/1994 | Heep et al. |
| 5,329,239 A | 7/1994 | Kindermann et al. |
| 5,341,231 A | 8/1994 | Yamamoto et al. |
| 5,403,980 A | 4/1995 | Eckrich |
| 5,451,724 A | 9/1995 | Nakazawa et al. |
| 5,467,080 A | 11/1995 | Stoll et al. |
| 5,477,422 A | 12/1995 | Hooker et al. |
| 5,494,180 A | 2/1996 | Callahan |
| 5,512,836 A | 4/1996 | Chen et al. |
| 5,526,294 A | 6/1996 | Ono et al. |
| 5,548,268 A | 8/1996 | Collins |
| 5,566,702 A | 10/1996 | Philipp |
| 5,572,205 A | 11/1996 | Caldwell et al. |
| 5,586,042 A | 12/1996 | Pisau et al. |
| 5,594,222 A | 1/1997 | Caldwell |
| 5,598,527 A | 1/1997 | Debrus et al. |
| 5,670,886 A | 9/1997 | Wolff et al. |
| 5,681,515 A | 10/1997 | Pratt et al. |
| 5,730,165 A | 3/1998 | Philipp |
| 5,747,756 A | 5/1998 | Boedecker |
| 5,760,554 A | 6/1998 | Bustamante |
| 5,790,107 A | 8/1998 | Kasser et al. |
| 5,796,183 A | 8/1998 | Hourmand |
| 5,801,340 A | 9/1998 | Peter |
| 5,825,352 A | 10/1998 | Bisset et al. |
| 5,827,980 A | 10/1998 | Doemens et al. |
| 5,864,105 A | 1/1999 | Andrews |
| 5,867,111 A | 2/1999 | Caldwell et al. |
| 5,874,672 A | 2/1999 | Gerardi et al. |
| 5,880,538 A | 3/1999 | Schulz |
| 5,917,165 A | 6/1999 | Platt et al. |
| 5,920,309 A | 7/1999 | Bisset et al. |
| 5,942,733 A | 8/1999 | Allen et al. |
| 5,963,000 A | 10/1999 | Tsutsumi et al. |
| 5,973,417 A | 10/1999 | Goetz et al. |
| 5,973,623 A | 10/1999 | Gupta et al. |
| 6,010,742 A | 1/2000 | Tanabe et al. |
| 6,011,602 A | 1/2000 | Miyashita et al. |
| 6,031,465 A | 2/2000 | Burgess |
| 6,035,180 A | 3/2000 | Kubes et al. |
| 6,037,930 A | 3/2000 | Wolfe et al. |
| 6,040,534 A | 3/2000 | Beukema |
| 6,157,372 A | 12/2000 | Blackburn et al. |
| 6,172,666 B1 | 1/2001 | Okura |
| 6,215,476 B1 | 4/2001 | Depew et al. |
| 6,219,253 B1 | 4/2001 | Green |
| 6,231,111 B1 | 5/2001 | Carter et al. |
| 6,275,644 B1 | 8/2001 | Domas et al. |
| 6,288,707 B1 | 9/2001 | Philipp |
| 6,292,100 B1 | 9/2001 | Dowling |
| 6,310,611 B1 | 10/2001 | Caldwell |
| 6,320,282 B1 | 11/2001 | Caldwell |
| 6,323,919 B1 | 11/2001 | Yang et al. |
| 6,369,369 B2 | 4/2002 | Kochman et al. |
| 6,377,009 B1 | 4/2002 | Philipp |
| 6,379,017 B2 | 4/2002 | Nakabayashi et al. |
| 6,380,931 B1 | 4/2002 | Gillespie et al. |
| 6,404,158 B1 * | 6/2002 | Boisvert ............... B60J 7/0573 318/466 |
| 6,415,138 B2 | 7/2002 | Sirola et al. |
| 6,427,540 B1 | 8/2002 | Monroe et al. |
| 6,452,138 B1 | 9/2002 | Kochman et al. |
| 6,452,514 B1 | 9/2002 | Philipp |
| 6,456,027 B1 | 9/2002 | Pruessel |
| 6,457,355 B1 | 10/2002 | Philipp |
| 6,464,381 B2 | 10/2002 | Anderson, Jr. et al. |
| 6,466,036 B1 | 10/2002 | Philipp |
| 6,485,595 B1 | 11/2002 | Yenni, Jr. et al. |
| 6,529,125 B1 | 3/2003 | Butler et al. |
| 6,535,200 B2 | 3/2003 | Philipp |
| 6,535,694 B2 * | 3/2003 | Engle ................... G03B 17/38 250/221 |
| 6,537,359 B1 | 3/2003 | Spa |
| 6,538,579 B1 | 3/2003 | Yoshikawa et al. |
| 6,559,902 B1 | 5/2003 | Kusuda et al. |
| 6,587,097 B1 | 7/2003 | Aufderheide et al. |
| 6,603,306 B1 | 8/2003 | Olsson et al. |
| 6,607,413 B2 | 8/2003 | Stevenson et al. |
| 6,614,579 B2 | 9/2003 | Roberts et al. |
| 6,617,975 B1 | 9/2003 | Burgess |
| 6,639,159 B2 | 10/2003 | Anzai |
| 6,646,398 B1 | 11/2003 | Fukazawa et al. |
| 6,652,777 B2 | 11/2003 | Rapp et al. |
| 6,654,006 B2 | 11/2003 | Kawashima et al. |
| 6,661,239 B1 | 12/2003 | Ozick |
| 6,661,410 B2 | 12/2003 | Casebolt et al. |
| 6,664,489 B2 | 12/2003 | Kleinhans et al. |
| 6,713,897 B2 | 3/2004 | Caldwell |
| 6,734,377 B2 | 5/2004 | Gremm et al. |
| 6,738,051 B2 | 5/2004 | Boyd et al. |
| 6,740,416 B1 | 5/2004 | Yokogawa et al. |
| 6,756,970 B2 | 6/2004 | Keely, Jr. et al. |
| 6,773,129 B2 | 8/2004 | Anderson, Jr. et al. |
| 6,774,505 B1 | 8/2004 | Wnuk |
| 6,794,728 B1 | 9/2004 | Kithil |
| 6,795,226 B2 | 9/2004 | Agrawal et al. |
| 6,809,280 B2 | 10/2004 | Divigalpitiya et al. |
| 6,812,424 B2 | 11/2004 | Miyako |
| 6,819,316 B2 | 11/2004 | Schulz et al. |
| 6,819,990 B2 | 11/2004 | Ichinose |
| 6,825,752 B2 | 11/2004 | Nahata et al. |
| 6,834,373 B2 | 12/2004 | Dieberger |
| 6,841,748 B2 | 1/2005 | Serizawa et al. |
| 6,847,018 B2 | 1/2005 | Wong |
| 6,847,289 B2 | 1/2005 | Pang et al. |
| 6,854,870 B2 | 2/2005 | Huizenga |
| 6,879,250 B2 | 4/2005 | Fayt et al. |
| 6,884,936 B2 | 4/2005 | Takahashi et al. |
| 6,891,114 B2 | 5/2005 | Peterson |
| 6,891,530 B2 | 5/2005 | Umemoto et al. |
| 6,897,390 B2 | 5/2005 | Caldwell et al. |
| 6,929,900 B2 | 8/2005 | Farquhar et al. |
| 6,930,672 B1 | 8/2005 | Kuribayashi |
| 6,940,291 B1 | 9/2005 | Ozick |
| 6,960,735 B2 | 11/2005 | Hein et al. |

(56) References Cited

U.S. PATENT DOCUMENTS

| | | |
|---|---|---|
| 6,962,436 B1 | 11/2005 | Holloway et al. |
| 6,964,023 B2 | 11/2005 | Maes et al. |
| 6,966,225 B1 | 11/2005 | Mallary |
| 6,967,587 B2 | 11/2005 | Snell et al. |
| 6,977,615 B2 | 12/2005 | Brandwein, Jr. |
| 6,987,605 B2 | 1/2006 | Liang et al. |
| 6,993,607 B2 | 1/2006 | Philipp |
| 6,999,066 B2 | 2/2006 | Litwiller |
| 7,030,513 B2 | 4/2006 | Caldwell |
| 7,046,129 B2 | 5/2006 | Regnet et al. |
| 7,053,360 B2 | 5/2006 | Balp et al. |
| 7,063,379 B2 | 6/2006 | Steuer et al. |
| 7,091,836 B2 | 8/2006 | Kachouh et al. |
| 7,091,886 B2 | 8/2006 | DePue et al. |
| 7,098,414 B2 | 8/2006 | Caldwell |
| 7,105,752 B2 | 9/2006 | Tsai et al. |
| 7,106,171 B1 | 9/2006 | Burgess |
| 7,135,995 B2 | 11/2006 | Engelmann et al. |
| 7,146,024 B2 | 12/2006 | Benkley, III |
| 7,151,450 B2 | 12/2006 | Beggs et al. |
| 7,151,532 B2 | 12/2006 | Schulz |
| 7,154,481 B2 | 12/2006 | Cross et al. |
| 7,180,017 B2 | 2/2007 | Hein |
| 7,186,936 B2 | 3/2007 | Marcus et al. |
| 7,205,777 B2 | 4/2007 | Schulz et al. |
| 7,215,529 B2 | 5/2007 | Rosenau |
| 7,218,498 B2 | 5/2007 | Caldwell |
| 7,232,973 B2 | 6/2007 | Kaps et al. |
| 7,242,393 B2 | 7/2007 | Caldwell |
| 7,245,131 B2 | 7/2007 | Kurachi et al. |
| 7,248,151 B2 | 7/2007 | Mc Call |
| 7,248,955 B2 | 7/2007 | Hein et al. |
| 7,254,775 B2 | 8/2007 | Geaghan et al. |
| 7,255,466 B2 * | 8/2007 | Schmidt et al. ............... 362/501 |
| 7,255,622 B2 | 8/2007 | Stevenson et al. |
| 7,269,484 B2 | 9/2007 | Hein |
| 7,295,168 B2 | 11/2007 | Saegusa et al. |
| 7,295,904 B2 | 11/2007 | Kanevsky et al. |
| 7,339,579 B2 | 3/2008 | Richter et al. |
| 7,342,485 B2 | 3/2008 | Joehl et al. |
| 7,347,297 B2 * | 3/2008 | Ide ..................... B60R 21/0132 180/282 |
| 7,355,595 B2 | 4/2008 | Bathiche et al. |
| 7,361,860 B2 | 4/2008 | Caldwell |
| 7,385,308 B2 | 6/2008 | Yerdon et al. |
| 7,445,350 B2 | 11/2008 | Konet et al. |
| 7,447,575 B2 | 11/2008 | Goldbeck et al. |
| 7,479,788 B2 | 1/2009 | Bolender et al. |
| 7,489,053 B2 | 2/2009 | Gentile et al. |
| 7,521,941 B2 | 4/2009 | Ely et al. |
| 7,521,942 B2 | 4/2009 | Reynolds |
| 7,531,921 B2 | 5/2009 | Cencur |
| 7,532,202 B2 | 5/2009 | Roberts |
| 7,535,131 B1 | 5/2009 | Safieh, Jr. |
| 7,535,459 B2 | 5/2009 | You et al. |
| 7,567,240 B2 | 7/2009 | Peterson, Jr. et al. |
| 7,583,092 B2 | 9/2009 | Reynolds et al. |
| 7,643,010 B2 | 1/2010 | Westerman et al. |
| 7,653,883 B2 | 1/2010 | Hotelling et al. |
| 7,688,080 B2 | 3/2010 | Golovchenko et al. |
| 7,701,440 B2 | 4/2010 | Harley |
| 7,705,257 B2 | 4/2010 | Arione et al. |
| 7,708,120 B2 | 5/2010 | Einbinder |
| 7,710,245 B2 | 5/2010 | Pickering |
| 7,714,846 B1 | 5/2010 | Gray |
| 7,719,142 B2 | 5/2010 | Hein et al. |
| 7,728,819 B2 | 6/2010 | Inokawa |
| 7,737,953 B2 | 6/2010 | Mackey |
| 7,737,956 B2 | 6/2010 | Hsieh et al. |
| 7,777,732 B2 | 8/2010 | Herz et al. |
| 7,782,307 B2 | 8/2010 | Westerman et al. |
| 7,791,594 B2 | 9/2010 | Dunko |
| 7,795,882 B2 | 9/2010 | Kirchner et al. |
| 7,800,590 B2 | 9/2010 | Satoh et al. |
| 7,821,425 B2 | 10/2010 | Philipp |
| 7,834,853 B2 | 11/2010 | Finney et al. |
| 7,839,392 B2 | 11/2010 | Pak et al. |
| 7,876,310 B2 | 1/2011 | Westerman et al. |
| 7,881,940 B2 | 2/2011 | Dusterhoff |
| RE42,199 E | 3/2011 | Caldwell |
| 7,898,531 B2 | 3/2011 | Bowden et al. |
| 7,920,131 B2 | 4/2011 | Westerman |
| 7,924,143 B2 | 4/2011 | Griffin et al. |
| 7,957,864 B2 | 6/2011 | Lenneman et al. |
| 7,977,596 B2 | 7/2011 | Born et al. |
| 7,978,181 B2 | 7/2011 | Westerman |
| 7,989,752 B2 | 8/2011 | Yokozawa |
| 8,026,904 B2 | 9/2011 | Westerman |
| 8,050,876 B2 | 11/2011 | Feen et al. |
| 8,054,296 B2 | 11/2011 | Land et al. |
| 8,054,300 B2 | 11/2011 | Bernstein |
| 8,076,949 B1 | 12/2011 | Best et al. |
| 8,077,154 B2 | 12/2011 | Emig et al. |
| 8,090,497 B2 | 1/2012 | Ando |
| 8,253,425 B2 | 8/2012 | Reynolds et al. |
| 8,283,800 B2 | 10/2012 | Salter et al. |
| 8,330,385 B2 | 12/2012 | Salter et al. |
| 8,339,286 B2 | 12/2012 | Cordeiro |
| 8,386,027 B2 | 2/2013 | Chuang et al. |
| 8,454,181 B2 | 6/2013 | Salter et al. |
| 8,456,180 B2 | 6/2013 | Sitarski |
| 8,508,487 B2 | 8/2013 | Schwesig et al. |
| 8,517,383 B2 | 8/2013 | Wallace et al. |
| 8,537,107 B1 | 9/2013 | Li |
| 8,570,053 B1 | 10/2013 | Ryshtun et al. |
| 8,575,949 B2 | 11/2013 | Salter et al. |
| 8,659,414 B1 * | 2/2014 | Schuk ........................ 340/457 |
| 8,908,034 B2 * | 12/2014 | Bordonaro ....... G08B 13/19682 348/143 |
| 8,933,708 B2 | 1/2015 | Buttolo et al. |
| 8,981,265 B2 * | 3/2015 | Jiao et al. ..................... 219/507 |
| 2001/0019228 A1 | 9/2001 | Gremm |
| 2001/0028558 A1 | 10/2001 | Rapp et al. |
| 2002/0040266 A1 | 4/2002 | Edgar et al. |
| 2002/0084721 A1 | 7/2002 | Walczak |
| 2002/0093786 A1 | 7/2002 | Maser |
| 2002/0149376 A1 | 10/2002 | Haffner et al. |
| 2002/0167439 A1 | 11/2002 | Bloch et al. |
| 2002/0167704 A1 | 11/2002 | Kleinhans et al. |
| 2003/0002273 A1 | 1/2003 | Anderson, Jr. et al. |
| 2003/0101781 A1 | 6/2003 | Budzynski et al. |
| 2003/0122554 A1 * | 7/2003 | Karray et al. .................. 324/662 |
| 2003/0128116 A1 | 7/2003 | Ieda et al. |
| 2003/0189211 A1 * | 10/2003 | Dietz .................... G09G 3/3406 257/79 |
| 2004/0056753 A1 | 3/2004 | Chiang et al. |
| 2004/0090195 A1 * | 5/2004 | Motsenbocker ............... 318/109 |
| 2004/0145613 A1 | 7/2004 | Stavely et al. |
| 2004/0160072 A1 | 8/2004 | Carter et al. |
| 2004/0160234 A1 | 8/2004 | Denen et al. |
| 2004/0160713 A1 | 8/2004 | Wei |
| 2004/0197547 A1 | 10/2004 | Bristow et al. |
| 2004/0246239 A1 | 12/2004 | Knowles et al. |
| 2005/0012484 A1 | 1/2005 | Gifford et al. |
| 2005/0052429 A1 | 3/2005 | Philipp |
| 2005/0068045 A1 | 3/2005 | Inaba et al. |
| 2005/0068712 A1 * | 3/2005 | Schulz .................... E05B 81/78 361/287 |
| 2005/0073425 A1 | 4/2005 | Snell et al. |
| 2005/0088417 A1 | 4/2005 | Mulligan |
| 2005/0092097 A1 | 5/2005 | Shank et al. |
| 2005/0110769 A1 | 5/2005 | DaCosta et al. |
| 2005/0137765 A1 | 6/2005 | Hein et al. |
| 2005/0218913 A1 | 10/2005 | Inaba et al. |
| 2005/0242923 A1 | 11/2005 | Pearson et al. |
| 2005/0275567 A1 | 12/2005 | DePue et al. |
| 2005/0283280 A1 | 12/2005 | Evans, Jr. |
| 2006/0022682 A1 | 2/2006 | Nakamura et al. |
| 2006/0038793 A1 | 2/2006 | Philipp |
| 2006/0044800 A1 | 3/2006 | Reime |
| 2006/0055534 A1 | 3/2006 | Fergusson |
| 2006/0082545 A1 | 4/2006 | Choquet et al. |
| 2006/0170241 A1 | 8/2006 | Yamashita |
| 2006/0238518 A1 | 10/2006 | Westerman et al. |

(56) References Cited

U.S. PATENT DOCUMENTS

| | | |
|---|---|---|
| 2006/0238521 A1 | 10/2006 | Westerman et al. |
| 2006/0244733 A1 | 11/2006 | Geaghan |
| 2006/0250142 A1 | 11/2006 | Abe |
| 2006/0262549 A1 | 11/2006 | Schmidt et al. |
| 2006/0267953 A1 | 11/2006 | Peterson, Jr. et al. |
| 2006/0279015 A1 | 12/2006 | Wang |
| 2006/0287474 A1 | 12/2006 | Crawford et al. |
| 2007/0008726 A1 | 1/2007 | Brown |
| 2007/0023265 A1 | 2/2007 | Ishikawa et al. |
| 2007/0051609 A1 | 3/2007 | Parkinson |
| 2007/0068790 A1 | 3/2007 | Yerdon et al. |
| 2007/0096565 A1 | 5/2007 | Breed et al. |
| 2007/0103431 A1 | 5/2007 | Tabatowski-Bush |
| 2007/0115759 A1* | 5/2007 | Sano .............. G04G 5/002 368/47 |
| 2007/0206668 A1* | 9/2007 | Jin .............. H04B 3/46 375/224 |
| 2007/0226994 A1 | 10/2007 | Wollach et al. |
| 2007/0232779 A1 | 10/2007 | Moody et al. |
| 2007/0247429 A1 | 10/2007 | Westerman |
| 2007/0255468 A1 | 11/2007 | Strebel et al. |
| 2007/0257891 A1 | 11/2007 | Esenther et al. |
| 2007/0271072 A1 | 11/2007 | Kovacevich |
| 2007/0296709 A1 | 12/2007 | GuangHai |
| 2008/0012835 A1 | 1/2008 | Rimon et al. |
| 2008/0018604 A1 | 1/2008 | Paun et al. |
| 2008/0023715 A1 | 1/2008 | Choi |
| 2008/0030465 A1 | 2/2008 | Konet et al. |
| 2008/0074398 A1 | 3/2008 | Wright |
| 2008/0111714 A1 | 5/2008 | Kremin |
| 2008/0136792 A1 | 6/2008 | Peng et al. |
| 2008/0142352 A1 | 6/2008 | Wright |
| 2008/0143681 A1 | 6/2008 | XiaoPing |
| 2008/0150905 A1 | 6/2008 | Grivna et al. |
| 2008/0158146 A1 | 7/2008 | Westerman |
| 2008/0196945 A1 | 8/2008 | Konstas |
| 2008/0202912 A1 | 8/2008 | Boddie et al. |
| 2008/0231290 A1 | 9/2008 | Zhitomirsky |
| 2008/0238650 A1 | 10/2008 | Riihimaki et al. |
| 2008/0246723 A1* | 10/2008 | Baumbach .......... G06F 3/03547 345/156 |
| 2008/0257706 A1 | 10/2008 | Haag |
| 2008/0272623 A1 | 11/2008 | Kadzban et al. |
| 2009/0066659 A1 | 3/2009 | He et al. |
| 2009/0079699 A1 | 3/2009 | Sun |
| 2009/0108985 A1 | 4/2009 | Haag et al. |
| 2009/0115731 A1 | 5/2009 | Rak |
| 2009/0120697 A1 | 5/2009 | Wilner et al. |
| 2009/0135157 A1 | 5/2009 | Harley |
| 2009/0212849 A1 | 8/2009 | Reime |
| 2009/0225043 A1 | 9/2009 | Rosener |
| 2009/0235588 A1 | 9/2009 | Patterson et al. |
| 2009/0236210 A1 | 9/2009 | Clark et al. |
| 2009/0251435 A1 | 10/2009 | Westerman et al. |
| 2009/0256578 A1 | 10/2009 | Wuerstlein et al. |
| 2009/0256677 A1 | 10/2009 | Hein et al. |
| 2009/0273563 A1 | 11/2009 | Pryor |
| 2009/0295409 A1 | 12/2009 | Irkliy |
| 2009/0295556 A1 | 12/2009 | Inoue et al. |
| 2009/0309616 A1 | 12/2009 | Klinghult et al. |
| 2010/0001746 A1 | 1/2010 | Duchene et al. |
| 2010/0001974 A1 | 1/2010 | Su et al. |
| 2010/0007613 A1 | 1/2010 | Costa |
| 2010/0007620 A1 | 1/2010 | Hsieh et al. |
| 2010/0013777 A1 | 1/2010 | Baudisch et al. |
| 2010/0026654 A1 | 2/2010 | Suddreth |
| 2010/0039392 A1 | 2/2010 | Pratt et al. |
| 2010/0066391 A1 | 3/2010 | Hirasaka et al. |
| 2010/0090712 A1 | 4/2010 | Vandermeijden |
| 2010/0090966 A1 | 4/2010 | Gregorio |
| 2010/0102830 A1 | 4/2010 | Curtis et al. |
| 2010/0103139 A1 | 4/2010 | Soo et al. |
| 2010/0110037 A1 | 5/2010 | Huang et al. |
| 2010/0117970 A1 | 5/2010 | Burstrom et al. |
| 2010/0125393 A1 | 5/2010 | Jarvinen et al. |
| 2010/0156814 A1 | 6/2010 | Weber et al. |
| 2010/0177057 A1 | 7/2010 | Flint et al. |
| 2010/0188356 A1 | 7/2010 | Vu et al. |
| 2010/0188364 A1 | 7/2010 | Lin et al. |
| 2010/0194692 A1 | 8/2010 | Orr et al. |
| 2010/0207907 A1 | 8/2010 | Tanabe et al. |
| 2010/0212819 A1 | 8/2010 | Salter et al. |
| 2010/0214253 A1 | 8/2010 | Wu et al. |
| 2010/0219935 A1 | 9/2010 | Bingle et al. |
| 2010/0241431 A1 | 9/2010 | Weng et al. |
| 2010/0241983 A1 | 9/2010 | Walline et al. |
| 2010/0245286 A1 | 9/2010 | Parker |
| 2010/0250071 A1 | 9/2010 | Pala et al. |
| 2010/0252048 A1 | 10/2010 | Young et al. |
| 2010/0277431 A1 | 11/2010 | Klinghult |
| 2010/0280983 A1 | 11/2010 | Cho et al. |
| 2010/0286867 A1 | 11/2010 | Bergholz et al. |
| 2010/0289754 A1 | 11/2010 | Sleeman et al. |
| 2010/0289759 A1 | 11/2010 | Fisher et al. |
| 2010/0296303 A1 | 11/2010 | Sarioglu et al. |
| 2010/0302200 A1 | 12/2010 | Netherton et al. |
| 2010/0315267 A1 | 12/2010 | Chung et al. |
| 2010/0321214 A1 | 12/2010 | Wang et al. |
| 2010/0321321 A1 | 12/2010 | Shenfield et al. |
| 2010/0321335 A1 | 12/2010 | Lim et al. |
| 2010/0328261 A1 | 12/2010 | Woolley et al. |
| 2010/0328262 A1 | 12/2010 | Huang et al. |
| 2011/0001707 A1 | 1/2011 | Faubert et al. |
| 2011/0001722 A1 | 1/2011 | Newman et al. |
| 2011/0007021 A1 | 1/2011 | Bernstein et al. |
| 2011/0007023 A1 | 1/2011 | Abrahamsson et al. |
| 2011/0012623 A1 | 1/2011 | Gastel et al. |
| 2011/0018744 A1 | 1/2011 | Philipp |
| 2011/0018817 A1 | 1/2011 | Kryze et al. |
| 2011/0022393 A1 | 1/2011 | Waller et al. |
| 2011/0031983 A1 | 2/2011 | David et al. |
| 2011/0034219 A1 | 2/2011 | Filson et al. |
| 2011/0037725 A1 | 2/2011 | Pryor |
| 2011/0037735 A1 | 2/2011 | Land et al. |
| 2011/0039602 A1 | 2/2011 | McNamara et al. |
| 2011/0041409 A1 | 2/2011 | Newman et al. |
| 2011/0043481 A1 | 2/2011 | Bruwer |
| 2011/0050251 A1 | 3/2011 | Franke et al. |
| 2011/0050587 A1 | 3/2011 | Natanzon et al. |
| 2011/0050618 A1 | 3/2011 | Murphy et al. |
| 2011/0050620 A1 | 3/2011 | Hristov |
| 2011/0055753 A1 | 3/2011 | Horodezky et al. |
| 2011/0057899 A1 | 3/2011 | Sleeman et al. |
| 2011/0062969 A1 | 3/2011 | Hargreaves et al. |
| 2011/0063425 A1 | 3/2011 | Tieman |
| 2011/0074573 A1 | 3/2011 | Seshadri |
| 2011/0080365 A1 | 4/2011 | Westerman |
| 2011/0080366 A1 | 4/2011 | Bolender |
| 2011/0080376 A1 | 4/2011 | Kuo et al. |
| 2011/0082616 A1 | 4/2011 | Small et al. |
| 2011/0083110 A1 | 4/2011 | Griffin et al. |
| 2011/0095997 A1 | 4/2011 | Philipp |
| 2011/0115732 A1 | 5/2011 | Coni et al. |
| 2011/0115742 A1 | 5/2011 | Sobel et al. |
| 2011/0134047 A1 | 6/2011 | Wigdor et al. |
| 2011/0134054 A1 | 6/2011 | Woo et al. |
| 2011/0139934 A1 | 6/2011 | Giesa et al. |
| 2011/0141006 A1 | 6/2011 | Rabu |
| 2011/0141041 A1 | 6/2011 | Parkinson et al. |
| 2011/0148803 A1 | 6/2011 | Xu |
| 2011/0157037 A1 | 6/2011 | Shamir et al. |
| 2011/0157079 A1 | 6/2011 | Wu et al. |
| 2011/0157080 A1 | 6/2011 | Ciesla et al. |
| 2011/0157089 A1 | 6/2011 | Rainisto |
| 2011/0161001 A1 | 6/2011 | Fink |
| 2011/0163764 A1 | 7/2011 | Shank et al. |
| 2011/0169758 A1 | 7/2011 | Aono |
| 2011/0187492 A1 | 8/2011 | Newman et al. |
| 2011/0210755 A1 | 9/2011 | Ogawa |
| 2011/0279276 A1 | 11/2011 | Newham |
| 2011/0279409 A1 | 11/2011 | Salaverry et al. |
| 2011/0309912 A1 | 12/2011 | Muller |
| 2012/0007821 A1 | 1/2012 | Zaliva |
| 2012/0037485 A1* | 2/2012 | Sitarski .............. H03K 17/955 |

(56) References Cited

U.S. PATENT DOCUMENTS

| | | | 200/600 |
|---|---|---|---|
| 2012/0043973 A1 | 2/2012 | Kremin | |
| 2012/0043976 A1 | 2/2012 | Bokma et al. | |
| 2012/0055557 A1 | 3/2012 | Belz et al. | |
| 2012/0062247 A1 | 3/2012 | Chang | |
| 2012/0062498 A1 | 3/2012 | Weaver et al. | |
| 2012/0068956 A1 | 3/2012 | Jira et al. | |
| 2012/0104790 A1 | 5/2012 | Plavetich et al. | |
| 2012/0154324 A1 | 6/2012 | Wright et al. | |
| 2012/0217147 A1 | 8/2012 | Porter et al. | |
| 2012/0293447 A1* | 11/2012 | Heng .................... | G06F 3/0418 345/174 |
| 2012/0312676 A1 | 12/2012 | Salter et al. | |
| 2012/0313648 A1 | 12/2012 | Salter et al. | |
| 2012/0313767 A1 | 12/2012 | Sitarski | |
| 2012/0319992 A1 | 12/2012 | Lee | |
| 2013/0024169 A1 | 1/2013 | Veerasamy | |
| 2013/0033356 A1 | 2/2013 | Sitarski et al. | |
| 2013/0076121 A1 | 3/2013 | Salter et al. | |
| 2013/0093500 A1 | 4/2013 | Bruwer | |
| 2013/0106436 A1 | 5/2013 | Brunet et al. | |
| 2013/0113397 A1 | 5/2013 | Salter et al. | |
| 2013/0113544 A1 | 5/2013 | Salter et al. | |
| 2013/0126325 A1 | 5/2013 | Curtis et al. | |
| 2013/0170013 A1 | 7/2013 | Tonar et al. | |
| 2013/0270896 A1 | 10/2013 | Buttolo et al. | |
| 2013/0270899 A1 | 10/2013 | Buttolo et al. | |
| 2013/0271157 A1 | 10/2013 | Buttolo et al. | |
| 2013/0271159 A1 | 10/2013 | Santos et al. | |
| 2013/0271182 A1 | 10/2013 | Buttolo et al. | |
| 2013/0271202 A1 | 10/2013 | Buttolo et al. | |
| 2013/0271203 A1 | 10/2013 | Salter et al. | |
| 2013/0271204 A1 | 10/2013 | Salter et al. | |
| 2013/0291439 A1 | 11/2013 | Wuerstlein et al. | |
| 2013/0307610 A1 | 11/2013 | Salter et al. | |
| 2013/0321065 A1 | 12/2013 | Salter et al. | |
| 2014/0002405 A1 | 1/2014 | Salter et al. | |
| 2014/0145733 A1 | 5/2014 | Buttolo et al. | |
| 2014/0252879 A1 | 9/2014 | Dassanayake et al. | |
| 2014/0306723 A1 | 10/2014 | Salter et al. | |
| 2014/0306724 A1 | 10/2014 | Dassanayake et al. | |
| 2015/0077227 A1 | 3/2015 | Salter et al. | |
| 2015/0180471 A1 | 6/2015 | Buttolo et al. | |
| 2015/0229305 A1 | 8/2015 | Buttolo et al. | |

FOREIGN PATENT DOCUMENTS

| EP | 1327860 | | 7/2003 |
|---|---|---|---|
| EP | 1562293 | | 8/2005 |
| EP | 2133777 | | 10/2011 |
| EP | 2133777 | B1 | 10/2011 |
| GB | 2071338 | | 9/1981 |
| GB | 2158737 | | 11/1985 |
| GB | 2279750 | A1 | 1/1995 |
| GB | 2409578 | | 6/2005 |
| GB | 2418741 | | 4/2006 |
| JP | 61188515 | | 8/1986 |
| JP | 4065038 | | 3/1992 |
| JP | 04082416 | | 3/1992 |
| JP | 07315880 | | 12/1995 |
| JP | 08138446 | | 5/1996 |
| JP | 11065764 | | 3/1999 |
| JP | 11110131 | | 4/1999 |
| JP | 11260133 | | 9/1999 |
| JP | 11316553 | | 11/1999 |
| JP | 2000047178 | | 2/2000 |
| JP | 2000075293 | | 3/2000 |
| JP | 2001013868 | | 1/2001 |
| JP | 2006007764 | | 1/2006 |
| JP | 2007027034 | A2 | 2/2007 |
| JP | 2008033701 | A | 2/2008 |
| JP | 2010139362 | A | 6/2010 |
| JP | 2010165618 | A | 7/2010 |
| JP | 2010218422 | | 9/2010 |
| JP | 2010239587 | | 10/2010 |
| JP | 2010287148 | A | 12/2010 |
| JP | 2011014280 | A | 8/2011 |
| KR | 20040110463 | | 12/2004 |
| KR | 20090127544 | | 12/2009 |
| KR | 20100114768 | | 10/2010 |
| KR | 101258376 | | 4/2013 |
| WO | 9636960 | | 11/1996 |
| WO | 9963394 | | 12/1999 |
| WO | 2006093398 | | 9/2006 |
| WO | 2007022027 | | 2/2007 |
| WO | 2008121760 | | 10/2008 |
| WO | 2009054592 | A1 | 4/2009 |
| WO | 2010111362 | A1 | 9/2010 |
| WO | 2012032318 | | 3/2012 |
| WO | 2012032318 | A1 | 3/2012 |
| WO | 2012169106 | | 12/2012 |
| WO | 2012169106 | A1 | 12/2012 |

OTHER PUBLICATIONS

U.S. Appl. No. 14/552,809, filed Nov. 25, 2014, entitled "Proximity Switch Based Door Latch Release," (14 pages of specification and 4 pages of drawings) and Official Filing Receipt (3 pages).

U.S. Appl. No. 14/314,328, filed Jun. 25, 2014, entitled "Proximity Switch Assembly Having Pliable Surface and Depression," (43 pages of specification and 24 pages of drawings) and Official Filing Receipt (3 pages).

U.S. Appl. No. 14/314,364, filed Jun. 25, 2014, entitled "Proximity Switch Assembly Having Groove Between Adjacent Proximity Sensors," (43 pages of specification and 24 pages of drawings) and Official Filing Receipt (3 pages).

Van Ess, Dave et al., "Capacitive Touch Switches for Automotive Applications," 7 pages, Published in Automotive DesignLine, www.automotiedesignline.com, Feb. 2006.

Kliffken, Marksu G. et al., "Obstacle Detection for Power Operated Window-Lift and Sunroof Actuation Systems," Paper No. 2001-01-0466, 1 page, © 2011 SAE International, Published Mar. 5, 2001.

"Moisture Immunity in QuickSense Studio," AN552, Rev. 0.1 10/10, 8 pages, Silicon Laboratories, Inc., © 2010.

"Clevios P Formulation Guide," 12 pages, www.clevios.com, Heraeus Clevios GmbH, no date provided.

"Orgacon EL-P3000, Screen printing Ink Series 3000," 2 pages, AGFA, last updated in Feb. 2006.

U.S. Appl. No. 13/609,390, filed Sep. 11, 2012, entitled "Proximity Switch Based Door Latch Release," (14 pages of specification and 4 pages of drawings) and Official Filing Receipt (3 pages).

U.S. Appl. No. 13/665,253, filed Oct. 31, 2012, entitled Proximity Switch Assembly Having Round Layer, (15 pages of specification and 7 pages of drawings) and Official Filing Receipt (3 pages).

U.S. Appl. No. 13/799,413, filed Mar. 13, 2013, entitled "Proximity Interface Development System Having Replicator and Method," (29 pages of specification and 20 pages of drawings) and Official Filing Receipt (3 pages).

U.S. Appl. No. 13/799,478, filed Mar. 13, 2013, entitled "Proximity Interface Development System Having Analyzer and Method," (29 pages of specification and 20 pages of drawings) and Official Filing Receipt (3 pages).

U.S. Appl. No. 14/168,614, filed Jan. 30, 2014, entitled "Proximity Switch Assembly and Activation Method Having Virtual Button Mode," (30 pages of specification and 15 pages of drawings) and Official Filing Receipt (3 pages).

U.S. Appl. No. 14/689,324, filed Apr. 17, 2015, entitled "Proximity Switch Assembly With Signal Drift Rejection and Method," (35 pages of specification and 17 pages of drawings) and Official Filing Receipt (3 pages).

U.S. Appl. No. 14/717,031, filed May 20, 2015, entitled "Proximity Sensor Assembly Having Interleaved Electrode Configuration," (38 pages of specification and 21 pages of drawings) and Official Filing Receipt (3 pages).

U.S. Appl. No. 14/635,140, filed Mar. 2, 2015, entitled "Proximity Switch Having Wrong Touch Adaptive Learning and Method," (20 pages of specification and 7 pages of drawings) and Official Filing Receipt (3 pages).

(56) References Cited

OTHER PUBLICATIONS

U.S. Appl. No. 14/661,325, filed Mar. 18, 2015, entitled "Proximity Switch Assembly Having Haptic Feedback and Method," (31 pages of specification and 15 pages of drawings) and Official Filing Receipt (3 pages).

U.S. Appl. No. 13/157,012, filed Jun. 9, 2011, entitled "Proximity Switch Having Sensitivity Control and Method Therefor," specification and drawings (17 pages) and filing receipt (3 pages).

U.S. Appl. No. 13/157,028, filed Jun. 9, 2011, entitled "Proximity Switch Having Learned Sensitivity and Method Therefor," specification and drawings (21 pages) and filing receipt (3 pages).

"Touch Sensors Design Guide," by ATEMI, 10620 D-AT42-04/09, Revised Apr. 2009, 72 pages, Copyrighted 2008-2009 Atmel Corporation.

JVC KD-AVX777 Detachable Front-Panel With Integrated 5.4," touch Screen Monitor, 6 pages, www.crutchfield.com, no date provides.

NXP Capacitive Sensors, 1 page, www.nxp.com, copyrighted 2006-2010, NXP Semiconductors.

Densitron Displays. "Introduction to Touch Solutions," White Paper, Revision 1.0 A, 14 pages, Aug. 17, 2007.

"Charge-Transfer Sensing-Based Touch Controls Facilitate Creative Interfaces," www.ferret.com.au, 2 pages, Jan. 18, 2006.

Kiosk Peripherals, "Touch Screen," www.bitsbytesintegrators.com/kiosk-peripherals.html, 10 pages, no date provided.

Ergonomic Palm Buttons, Pepperl+Fuchs, www.wolfautomation.com, 6 pages, no date provided.

* cited by examiner

PROXIMITY SWITCH AND METHOD OF ADJUSTING SENSITIVITY THEREFOR

FIELD OF THE INVENTION

The present invention generally relates to switches, and more particularly relates to proximity switches with enhanced sensitivity control.

BACKGROUND OF THE INVENTION

Automotive vehicles are typically equipped with various user actuated switches, such as switches for operating devices including powered windows, headlights, windshield wipers, moonroofs or sunroofs, interior lighting, radio and infotainment devices, and various other devices. Generally, these types of switches need to be actuated by a user in order to activate or deactivate a device or perform some type of control function. Proximity switches, such as capacitive switches, employ one or more proximity sensors to generate a sense activation field and sense changes to the activation field indicative of user actuation of the switch typically caused by a user's finger in close proximity or contact with the sensor. Proximity switches are typically configured to detect user actuation of the switch based on comparison of the sense activation field to a threshold. Unfortunately, different users often have different size fingers, different length finger nails, different actuation techniques, and may wear gloves exhibiting different dielectric properties, all of which may affect the results of the comparison of the actuation field to the threshold value which may result in different actuation detection levels. It is desirable to provide for an enhanced proximity switch that allows for such variations in use.

SUMMARY OF THE INVENTION

According to one aspect of the present invention, a proximity switch having sensitivity control is provided. The proximity switch includes a proximity sensor providing a sense activation field and generating a signal. The proximity switch further includes control circuitry detecting activation of the proximity switch based on the signal compared to a threshold and adjusting the threshold to control sensitivity. The threshold is decreased when the signal is less than the threshold for a minimum time period, and is increased when the signal exceeds the threshold by a predetermined value.

According to another aspect of the present invention, a vehicle capacitive switch having sensitive control is provided. The capacitive sensor installed in a vehicle providing a sense activation field and generating a signal. The vehicle capacitive switch also including control circuitry detecting activation of the proximity switch based on the signal compared to a threshold and adjusting the threshold to control sensitivity. The threshold is decreased when the signal is substantially stable and less than the threshold for a minimum time period, and is increased when the signal exceeds the threshold by a predetermined value.

According to a further aspect of the present invention, a method of sensing user proximity is provided. The method includes the steps of generating a sense activation field with a proximity sensor and generating a signal with the proximity sensor in response to user interaction. The method further includes the steps of detecting activation of the proximity switch by comparing the signal to a threshold and decreasing the threshold when the signal is detected below the threshold for a minimum time period. The method also includes the step of increasing the threshold when the signal exceeds the threshold by a predetermined value.

These and other aspects, objects, and features of the present invention will be understood and appreciated by those skilled in the art upon studying the following specification, claims, and appended drawings.

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
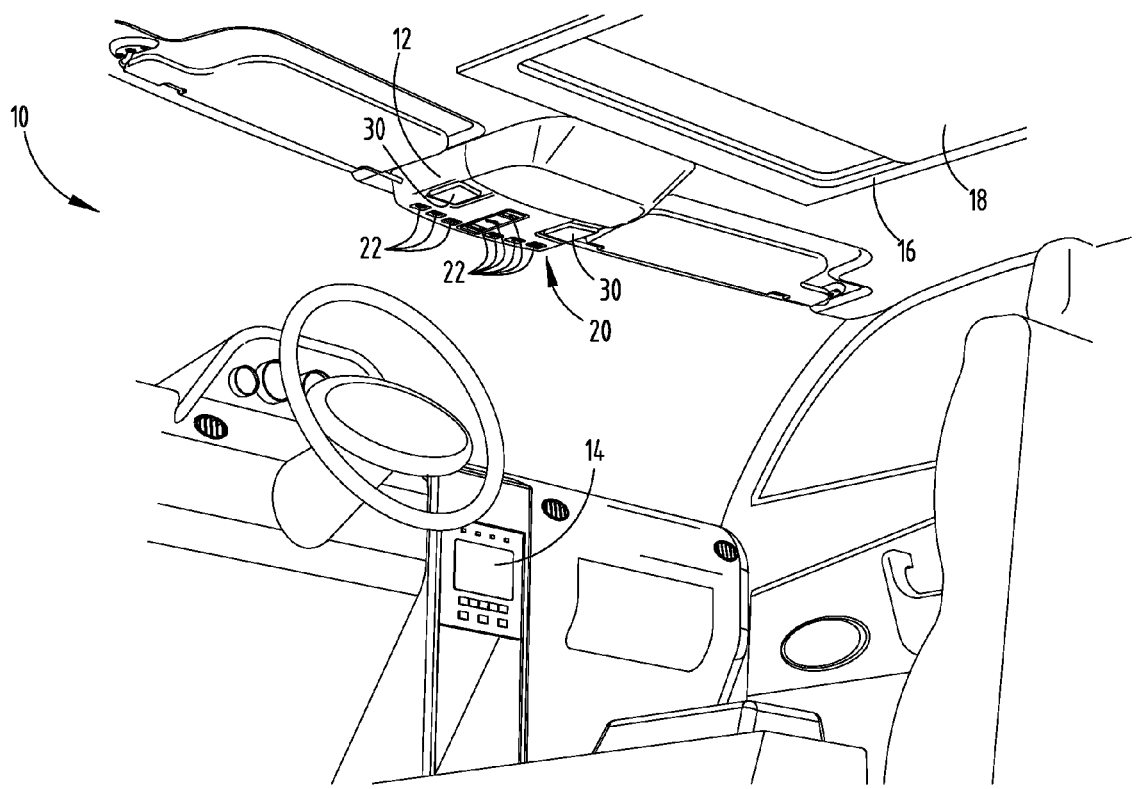
FIG. 1 is a perspective view of a passenger compartment of an automotive vehicle having an overhead console employing proximity switches having learned sensitivity control, according to one embodiment.
Figure 2:
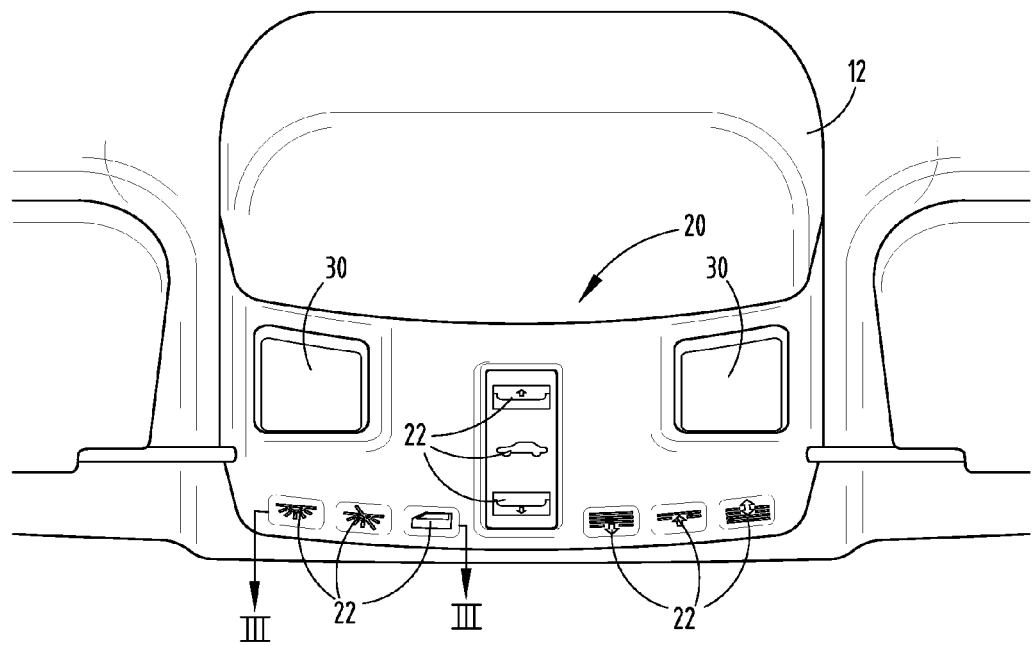
FIG. 2 is an enlarged view of the overhead console and proximity switch assembly shown in FIG. 1.

Referring to FIGS. 1 and 2, the interior of an automotive vehicle 10 is generally illustrated having a passenger compartment and a switch assembly 20 employing a plurality of proximity switches 22 having switch activation processing with sensitivity adjustment, according to one embodiment. The vehicle 10 generally includes an overhead console 12 assembled to the headliner on the underside of the roof or ceiling at the top of the vehicle passenger compartment, generally above the front passenger seating area. The switch assembly 20 has a plurality of proximity switches 22 arranged close to one another in the overhead console 12, according to one embodiment. The various proximity switches 22 may control any of a number of vehicle devices and functions, such as controlling movement of a sunroof or moonroof 16, controlling movement of a moonroof shade 18, controlling activation of one or more lighting devices such as interior map/reading and dome lights 30, and various other devices and functions. However, it should be appreciated that the proximity switches 22 may be located elsewhere on the vehicle 10, such as in the dash panel, on a door, on other consoles such as a center console, integrated into a touch screen display 14 for a radio or infotainment system such as a navigation and/or audio display, or located elsewhere onboard the vehicle 10 according to various vehicle applications.

The proximity switches 22 are shown and described herein as capacitive switches, according to one embodiment. Each proximity switch 22 includes at least one proximity sensor that provides a sense activation field to sense contact or close proximity (e.g., within one millimeter) of a user in relation to the one or more proximity sensors, such as a swiping motion by a user's finger. Thus, the sense activation field of each proximity switch 22 is a capacitive field in the exemplary embodiment and the user's finger has electrical conductivity and dielectric properties that cause a change or disturbance in the sense activation field as should be evident to those skilled in the art. However, it should also be appreciated by those skilled in the art that additional or alternative types of proximity sensors can be used, such as, but not limited to, inductive sensors, optical sensors, temperatures sensors, resistive sensors, the like, or a combination thereof. Exemplary proximity sensors are described in the Apr. 9, 2009, ATMEL® Touch Sensors Design Guide, 10620 D-AT42-04/09, the entire reference hereby being incorporated herein by reference.

The proximity switches 22 shown in FIGS. 1 and 2 each provide control of a vehicle component or device or provide a designated control function. One or more of the proximity switches 22 may be dedicated to controlling movement of a sunroof or moonroof 16 so as to cause the moonroof 16 to move in an open or closed direction, tilt the moonroof, or stop movement of the moonroof based upon a control algorithm. One or more other proximity switches 22 may be dedicated to controlling movement of a moonroof shade 18 between open and closed positions. Each of the moonroof 16 and shade 18 may be actuated by an electric motor in response to actuation of the corresponding proximity switch 22. Other proximity switches 22 may be dedicated to controlling other devices, such as turning an interior map/reading light 30 on, turning an interior map/reading light 30 off, turning a dome lamp on or off, unlocking a trunk, opening a rear hatch, or defeating a door light switch. Additional controls via the proximity switches 22 may include actuating door power windows up and down. Various other vehicle controls may be controlled by way of the proximity switches 22 described herein.

Figure 3:
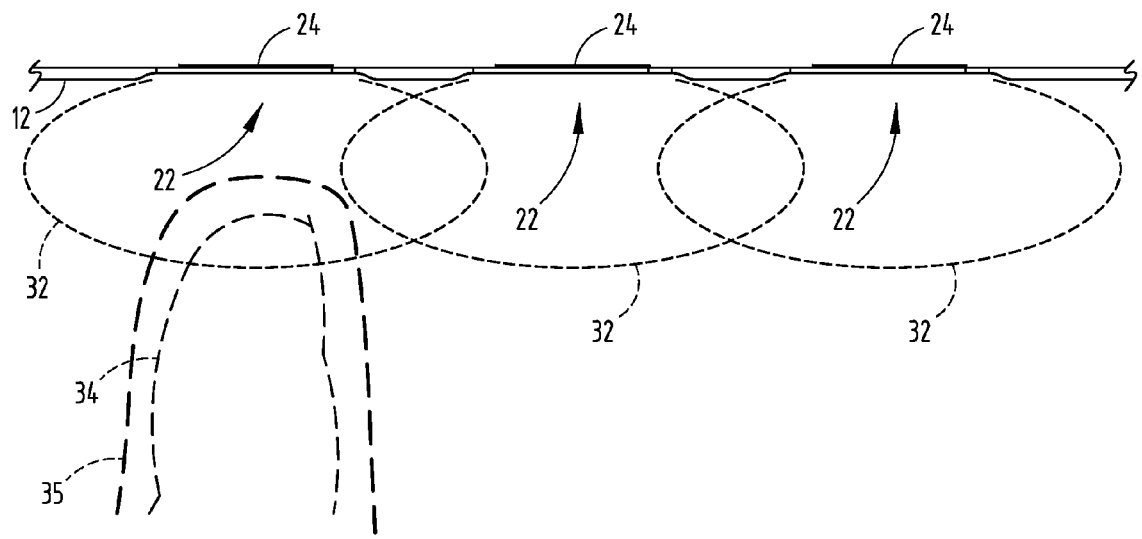
FIG. 3 is an enlarged cross-sectional view taken through line III-III in FIG. 2 showing an array of proximity switches in relation to a user's gloved finger.
Figure 4:
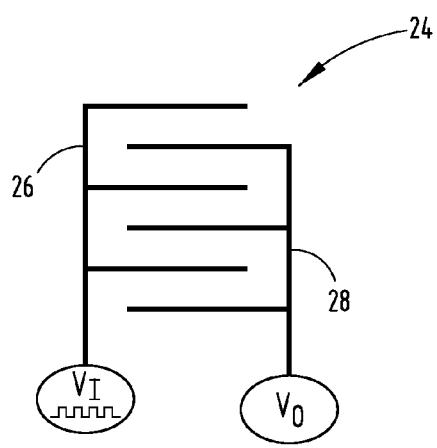
FIG. 4 is a schematic diagram of a capacitive sensor employed in each of the capacitive switches shown in FIG. 3.

Referring to FIG. 3, a portion of the proximity switch assembly 20 is illustrated having an array of three serially arranged proximity switches 22 in close relation to one another in relation to a user's finger 34 shown covered by a glove 35 during use of the switch assembly 20. Each proximity switch 22 includes one or more proximity sensors 24 for generating a sense activation field. According to one embodiment, each of the proximity sensors 24 may be formed by printing conductive ink onto the top surface of the polymeric overhead console 12. One example of a printed ink proximity sensor 24 is shown in FIG. 4 generally having a drive electrode 26 and a receive electrode 28 each having interdigitated fingers for generating a capacitive field 32. It should be appreciated that each of the proximity sensors 24 may be otherwise formed such as by assembling a preformed conductive circuit trace onto a substrate according to other embodiments. The drive electrode 26 receives square wave drive pulses applied at voltage $V_I$. The receive electrode 28 has an output for generating an output voltage $V_O$. It should be appreciated that the electrodes 26 and 28 may be arranged in various other configurations for generating the capacitive field as the activation field 32.

In the embodiment shown and described herein, the drive electrode 26 of each proximity sensor 24 is applied with voltage input $V_I$ as square wave pulses having a charge pulse cycle sufficient to charge the receive electrode 28 to a desired voltage. The receive electrode 28 thereby serves as a measurement electrode. In the embodiment shown, adjacent sense activation fields 32 generated by adjacent proximity switches 22 overlap slightly, however, overlap may not exist according to other embodiments. When a user or operator, such as the user's finger 34, enters an activation field 32, the proximity switch assembly 20 detects the disturbance caused by the finger 34 to the activation field 32 and determines whether the disturbance is sufficient to activate the corresponding proximity switch 22. The disturbance of the activation field 32 is detected by processing the charge pulse signal associated with the corresponding signal channel. The signal may vary depending on different properties of the user's finger such as size or presence of a covering glove. When the user's finger 34 contacts two activation fields 32, the proximity switch assembly 20 detects the disturbance of both contacted activation fields 32 via separate signal channels. Each proximity switch 22 has its own dedicated signal channel generating charge pulse counts which is processed as discussed herein.

Figure 5:
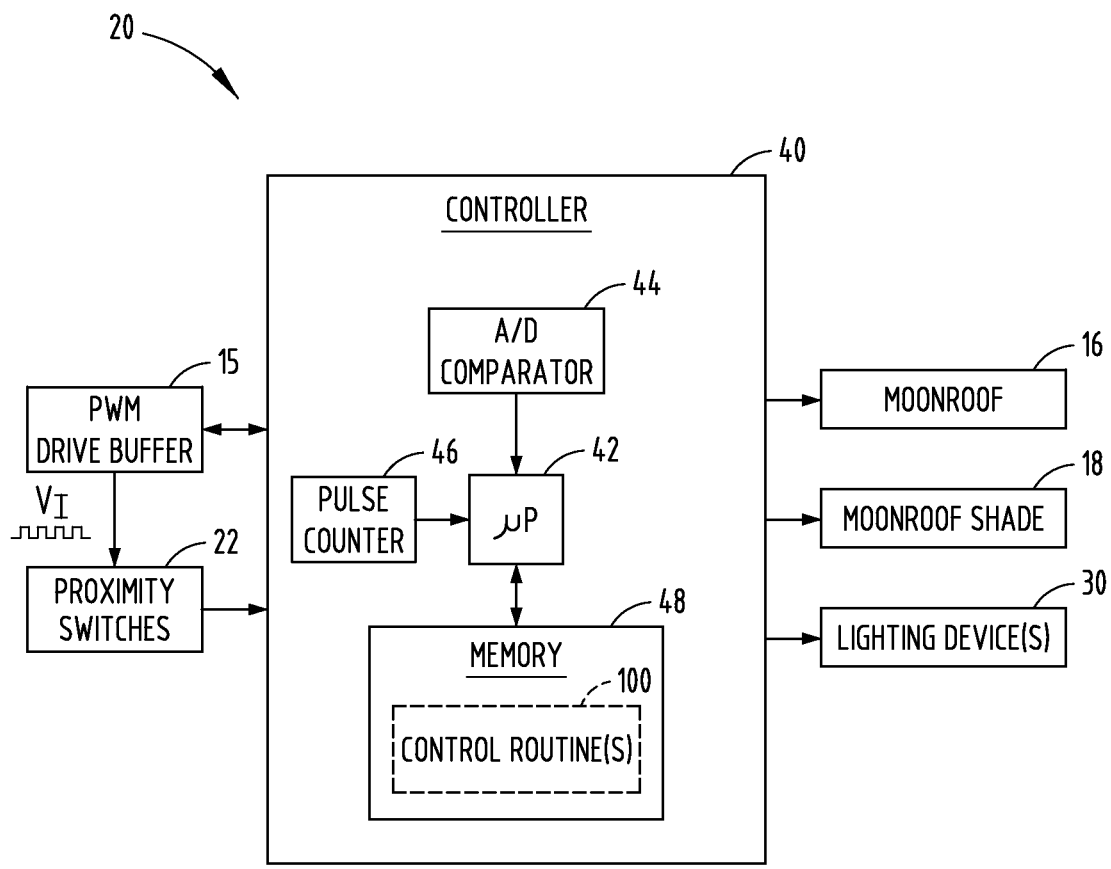
FIG. 5 is a block diagram illustrating the proximity switch assembly, according to one embodiment.

Referring to FIG. 5, the proximity switch assembly 20 is illustrated according to one embodiment. A plurality of proximity switches 22 are shown providing inputs to a controller 40, such as a microcontroller. The controller 40 may include control circuitry, such as a microprocessor 42 and memory 48. The control circuitry may include sense control circuitry processing the activation field of each sensor associated with each switch 22 to sense user activation of the corresponding switch by comparing the activation field signal to one or more thresholds pursuant to one or more control routines. The control circuitry also includes sensitivity control circuitry for learning user sensitivity of the switches based on user activation and controlling the sensitivity based on the learned user sensitivity. It should be appreciated that other analog and/or digital control circuitry may be employed to process each activation field, adjust the sensitivity, determine user activation, and initiate an action. The controller 40 may employ a QMatrix acquisition method available by ATMEL®, according to one embodiment. The ATMEL acquisition method employs a WINDOWS® host C/C++ compiler and debugger WinAVR to simplify development and testing the utility Hawkeye that allows monitoring in real-time the internal state of critical variables in the software as well as collecting logs of data for post-processing.

The controller 40 provides an output signal to one or more devices that are configured to perform dedicated actions responsive to activation of a proximity switch. For example, the one or more devices may include a moonroof 16 having a motor to move the moonroof panel between open and closed and tilt positions, a moonroof shade 18 that moves between open and closed positions, and lighting devices 30 that may be turned on and off Other devices may be controlled such as a radio for performing on and off functions, volume control, scanning, and other types of devices for performing other dedicated functions. One of the proximity switches 22 may be dedicated to actuating the moonroof closed, another proximity switch 22 may be dedicated to actuating the moonroof open, and a further switch 22 may be dedicated to actuating the moonroof to a tilt position, all of which would cause a motor to move the moonroof to a desired position. The moonroof shade 18 may be opened in response to one proximity switch 22 and may be closed responsive to another proximity switch 22.

The controller 40 is further shown having an analog to digital (A/D) comparator 44 coupled to the microprocessor 42. The A/D comparator 44 receives the voltage output $V_O$ from each of the proximity switches 22, converts the analog signal to a digital signal, and provides the digital signal to the microprocessor 42. Additionally, controller 40 includes a pulse counter 46 coupled to the microprocessor 42. The pulse counter 46 counts the charge signal pulses that are applied to each drive electrode of each proximity sensor, performs a count of the pulses needed to charge the capacitor until the voltage output $V_O$ reaches a predetermined voltage, and provides the count to the microprocessor 42. The pulse count is indicative of the change in capacitance of the corresponding capacitive sensor. The controller 40 is further shown communicating with a pulse width modulated drive buffer 15. The controller 40 provides a pulse width modulated signal to the pulse width modulated drive buffer 15 to generate a square wave pulse train $V_I$ which is applied to each drive electrode of each proximity sensor/switch 22. The controller 40 processes one or more control routines, such as control routine 100, stored in memory to make a determination as to activation of one of the switches and to adjust the sensitivity of the switches as described herein.

In FIGS. 6-10, the change in sensor charge pulse counts shown as Δ Sensor Count for a single signal channel associated with a proximity switch 22, shown in FIG. 3, is illustrated according to various examples. The change in sensor charge pulse count is the difference between an initialized referenced count value without any finger or other object present in the activation field and the corresponding sensor reading. In these examples, the user's finger enters an activation field 32 associated with one of the proximity switches as the user's finger moves across the switch. The signal channel is the change (Δ) in sensor charge pulse count associated with the capacitive sensor 24 associated with the switch. In the disclosed embodiment, the proximity sensors 24 are capacitive sensors. When a user's finger is in contact with or close proximity of a sensor 24, the finger alters the capacitance measured at the corresponding sensor 24. The capacitance is in parallel to the untouched sensor pad parasitic capacitance, and as such, measures as an offset. The user or operator induced capacitance is proportional to the user's finger or other body part dielectric constant, the surface exposed to the capacitive pad, and is inversely proportional to the distance of the user's limb to the switch button. According to one embodiment, each sensor is excited with a train of voltage pulses via pulse width modulation (PWM) electronics until the sensor is charged up to a set voltage potential. Such an acquisition method charges the receive electrode 28 to a known voltage potential. The cycle is repeated until the voltage across the measurement capacitor reaches a predetermined voltage. Placing a user's finger on the touch surface of the switch 24 introduces external capacitance that increases the amount of charge transferred each cycle, thereby reducing the total number of cycles required for the measurement capacitance to reach the predetermined voltage. The user's finger causes the change in sensor charge pulse count to increase since this value is based on the initialized reference count minus the sensor reading.

The proximity switch assembly is provided with sensitivity control to allow a user to operate the proximity switches with fingers having various electrical or dielectrical properties, such as may be experienced when a user is wearing a glove as opposed to not wearing a glove. Thus, users, such as users wearing gloves on their hands and fingers, may effectively operate the proximity switches. This is achieved by the proximity switch assembly learning the sensitivity of the user's finger as a user attempts to actuate the proximity switch assembly and increasing the sensitivity to accommodate the use of the glove on the hand or finger or decreasing the sensitivity when no glove is present. The sensitivity learning process may also be used to change the sensitivity to accommodate differences among the users' fingers, finger nail sizes, and swipe techniques such as distance from the finger to the proximity switch 22 during a swiping input motion. The electrical conductivity of users' fingers may vary among users which results in different changes or disturbances to the sense activation field. The sensitivity learning process advantageously adjusts the sensitivity to compensate for these variations in use.

The controller 40 processes one or more routines including sensitivity adjustment routines 100 stored in memory 48 and executable by the microprocessor 44 based upon the inputs of the one or more proximity switches 22. It should be appreciated that the controller 40 may adjust the sensitivity of the proximity switch 22 based on a learned sensitivity which is learned while a user uses the proximity switch assembly 20 to actuate one or more proximity switches 22. The sensitivity of each proximity switch 22 is adjusted by adjusting a threshold based on the learned sensitivity. The adjusted threshold is used to detect actuation of the switches by one or more users. In addition to detecting a gloved or ungloved finger, it should be appreciated that other variations such as size, shape, and other properties that affect the dielectric constant of the finger may be automatically adjusted by the sensitivity learning process so as to accommodate different uses and users.

Figure 6:
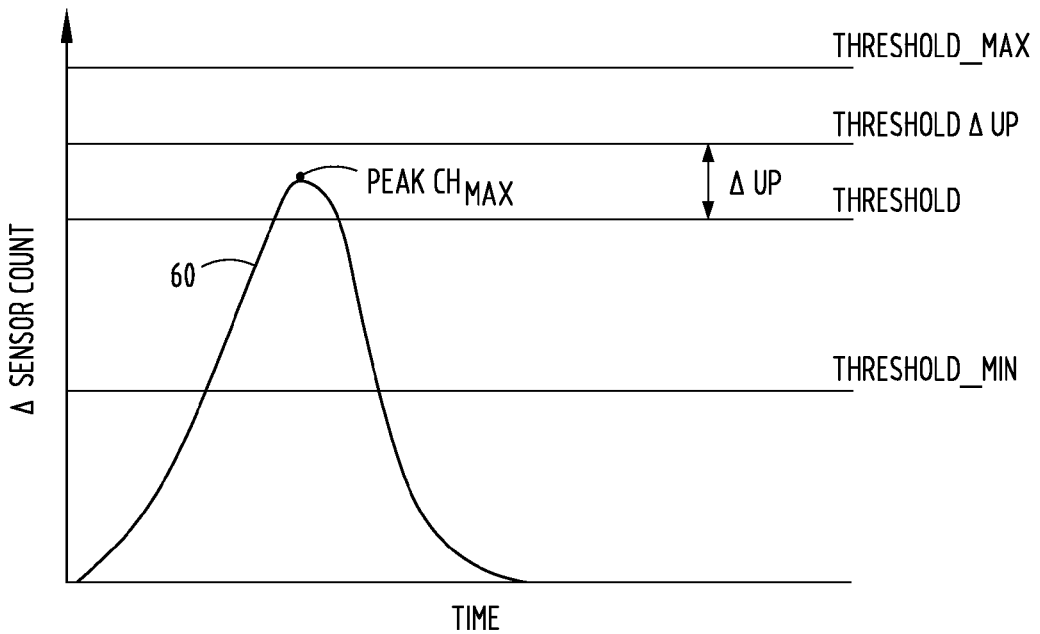
FIG. 6 is a graph illustrating a signal associated with a capacitive sensor showing an activation motion profile with no sensitivity adjustment.

Referring to FIG. 6, as the user's finger approaches a switch, the finger enters the activation field associated with the sensor which causes disruption to the capacitance, thereby resulting in a sensor count increase as shown by signal 60 having an activation motion profile that rises to exceed a threshold and reaches a peak value labeled PEAK $CH_{MAX}$, and then proceeds to drop as the finger leaves the sensor. In this example, the signal at its PEAK $CH_{MAX}$ value exceeds the threshold, and thus the switch is activated. The peak value PEAK $CH_{MAX}$ is also compared to the threshold value summed with Δ UP to determine if the PEAK $CH_{MAX}$ value exceeds a threshold+Δ UP. In this example, the PEAK $CH_{MAX}$ value is less than the threshold+Δ UP, such that no change in threshold value is made so there is no change to the sensitivity.

Figure 7:
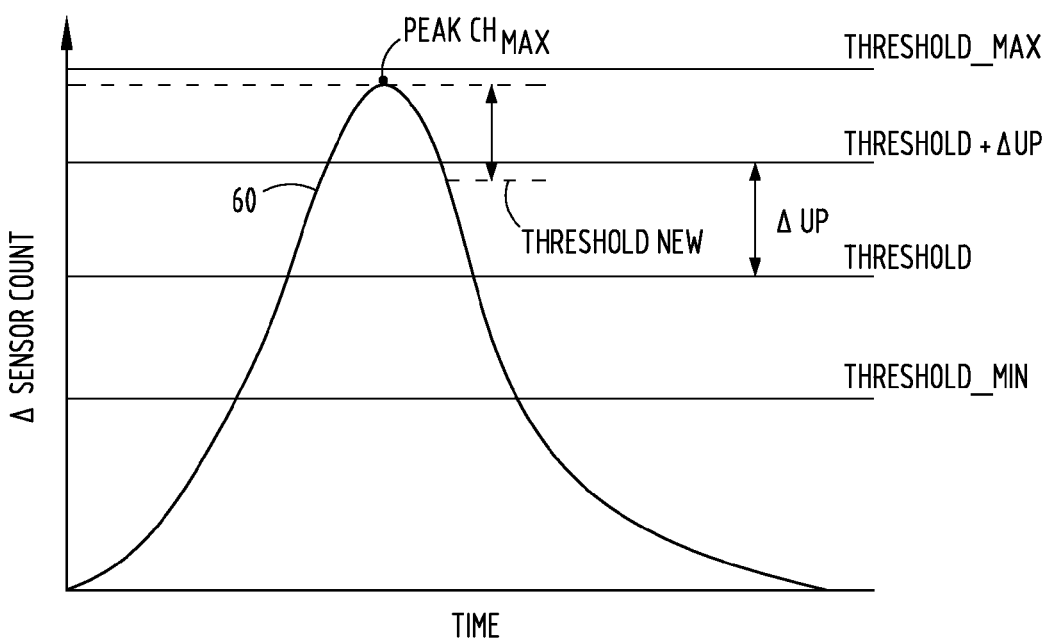
FIG. 7 is a graph illustrating a signal associated with a capacitive sensor showing an increased sensitivity adjustment.

Referring to FIG. 7, the activation motion profile for signal 60 associated with a switch is illustrated in which the signal 60 rises up to PEAK $CH_{MAX}$ value that exceeds the threshold+Δ UP. In this example, the PEAK $CH_{MAX}$ exceeds the threshold, such that the switch is activated. In addition, the PEAK $CH_{MAX}$ value is greater than the threshold+Δ UP, such that a change in the threshold value is made to adjust the sensitivity. Also, in this example, the PEAK $CH_{MAX}$ value is less than the THRESHOLD_MAX such that the threshold is adjusted up by the amount of the difference between PEAK $CH_{MAX}$ and $\Delta$ UP to the value shown as NEW THRESHOLD. Hence, when a large signal amplitude due to user activation is detected, the threshold is adjusted up by an amount of the difference in the PEAK $CH_{MAX}$–$\Delta$ UP so as to adjust the sensitivity.

Figure 8:
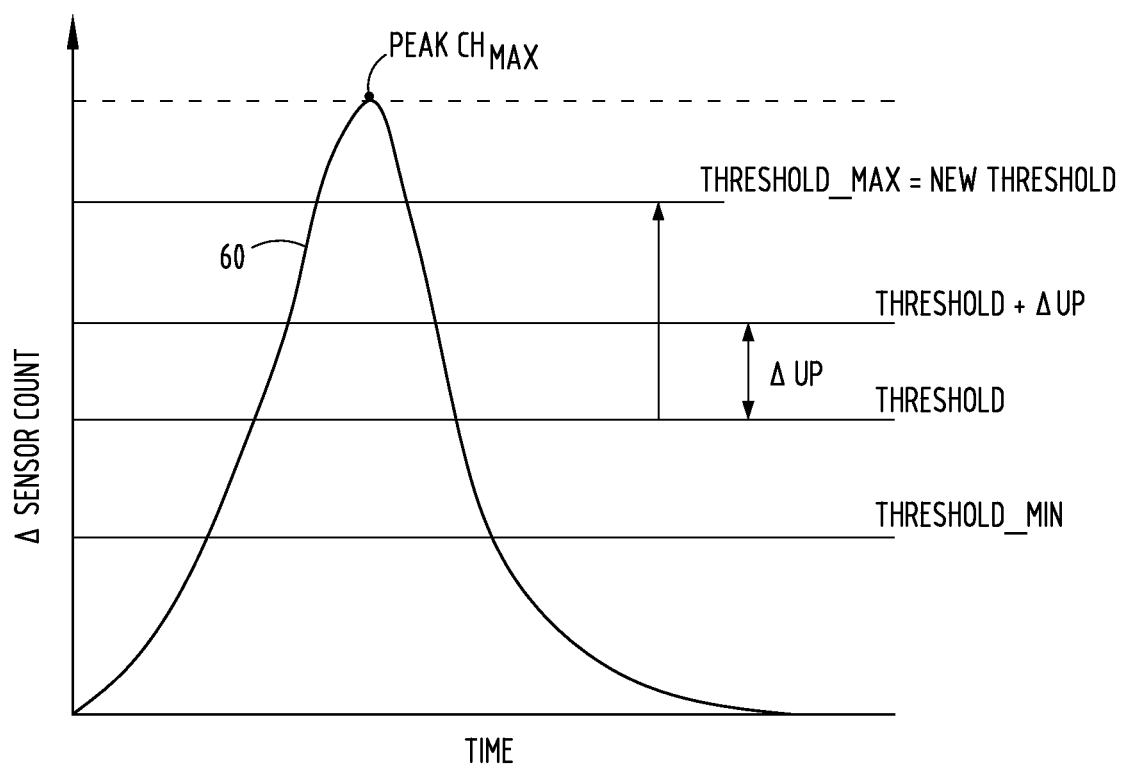
FIG. 8 is a graph illustrating a signal associated with a capacitive sensor showing an increased sensitivity adjustment to a peak value.

Referring to FIG. 8, the motion activation profile is illustrated for a switch in which the PEAK $CH_{MAX}$ value exceeds the THRESHOLD_MAX. In this example, since the PEAK $CH_{MAX}$ value is greater than the THRESHOLD, the switch is activated. In addition, the PEAK $CH_{MAX}$ value is greater than the THRESHOLD+$\Delta$ UP and exceeds the THRESHOLD_MAX such that the NEW THRESHOLD is adjusted to the THRESHOLD_MAX. Thus, adjustment of the threshold is limited on the upper end to THRESHOLD_MAX.

Figure 9:
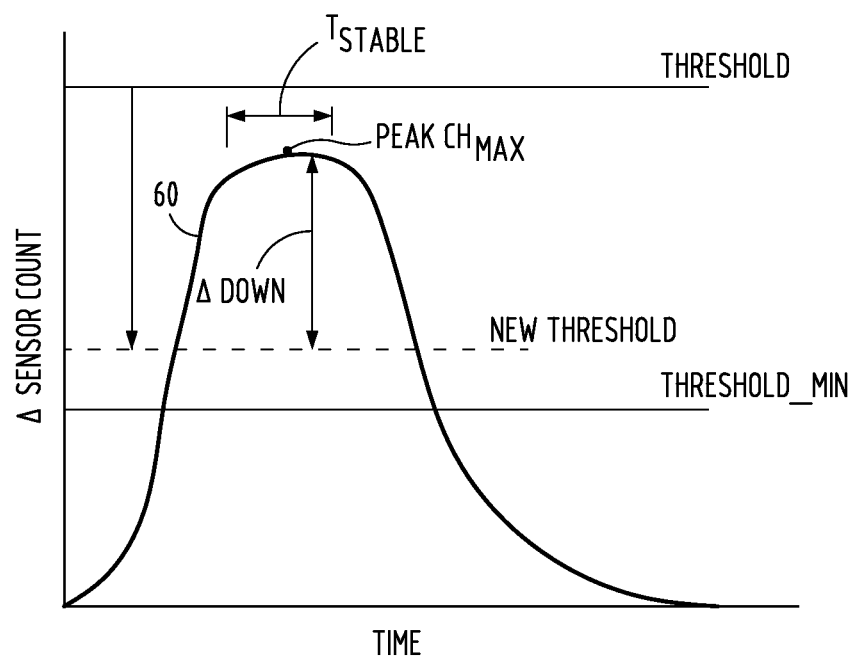
FIG. 9 is a graph illustrating a signal associated with a capacitive sensor showing a decreased sensitivity adjustment.

Referring to FIG. 9, the motion activation profile 60 for a switch is illustrated for an example in which a user is using a glove. In this example, the $\Delta$ sensor count value of signal 60 rises up to a PEAK $CH_{MAX}$ value that is less than the THRESHOLD value. When this occurs, the proximity switch assembly looks for a stable time period $T_{STABLE}$ of a sufficient time period, such as one second, to identify that the user is attempting to activate the switch, but the signal value is not strong enough, such as may occur when the user is wearing on a glove. By waiting a predetermined time period, such as one second, for a stable signal before making such a determination, the system allows for an adjustment of the sensitivity in a known manner. When the PEAK $CH_{MAX}$ value–$\Delta$ DOWN is greater than the THRESHOLD MIN, the threshold is set to a new threshold value reduced from PEAK $CH_{MAX}$ by the predetermined amount $\Delta$ DOWN so as to adjust the sensitivity. Thus, future activations of the switch will be determined by comparing the signal to a new reduced threshold at an increased sensitivity, which will allow for operation of the switch with the gloved finger.

Figure 10:
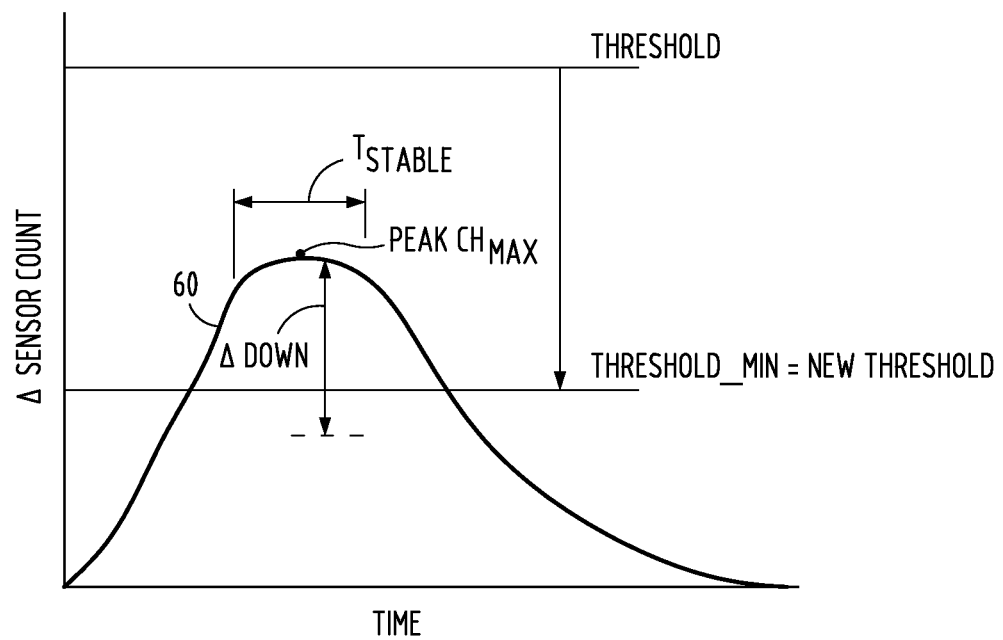
FIG. 10 is a graph illustrating a signal associated with a capacitive sensor showing a decreased sensitivity adjustment to a minimum value.

Referring to FIG. 10, the motion activation profile 60 for a switch is shown during which the user's finger is pressed on a button for a time period of $T_{STABLE}$ so as to adjust or reduce the threshold to a new threshold, limited by the THRESHOLD MIN. In this example, the amount of decrease of $\Delta$ DOWN subtracted from PEAK $CH_{MAX}$ is less than THRESHOLD MIN such that the reduced NEW THRESHOLD is limited to the threshold MIN value.

The proximity switch assembly and method sets the burst rate of the capacitive pad sensors at a fixed value, such as an optimal level, which may allow for a low signal-to-noise ratio, according to one embodiment. Thus, noise is rejected and inadvertent actuations may be prevented. The setting of the burst rate is such that the presence of a finger covered by a thick glove can be detected. In order to adjust sensitivity of the system and allow for use with or without gloves, the system and method adjusts the triggering level, such as a threshold, for recognition of an intended activation of a switch.

The proximity switch assembly and method detects an increase in the $\Delta$ sensor count when the PEAK $CH_{MAX}$ signal exceeds $\Delta$ UP and adjusts the sensitivity value by increasing the threshold to decrease the sensitivity. This allows a user not wearing gloves to automatically have the sensitivity increased to accommodate the use. When a user is wearing a glove or has a less sensitive finger that interacts with the capacitive sensors, the system and method decreases the threshold when the $\Delta$ sensor count signal at its PEAK $CH_{MAX}$ signal is below the threshold value with a clean signal that is stable for a sufficient period of time, such as 1.0 second. The stable time period $T_{STABLE}$ may be 0.5 to 1.0 seconds, according to one embodiment. The system and method therefore advantageously identifies that a user is trying to interact with the sensor, however, the user's finger has a reduced sensitivity to the sensors, such as may be caused by a glove covering the finger. When this occurs, the threshold value is reduced so as to increase the sensitivity of the proximity switches.

Figure 11:
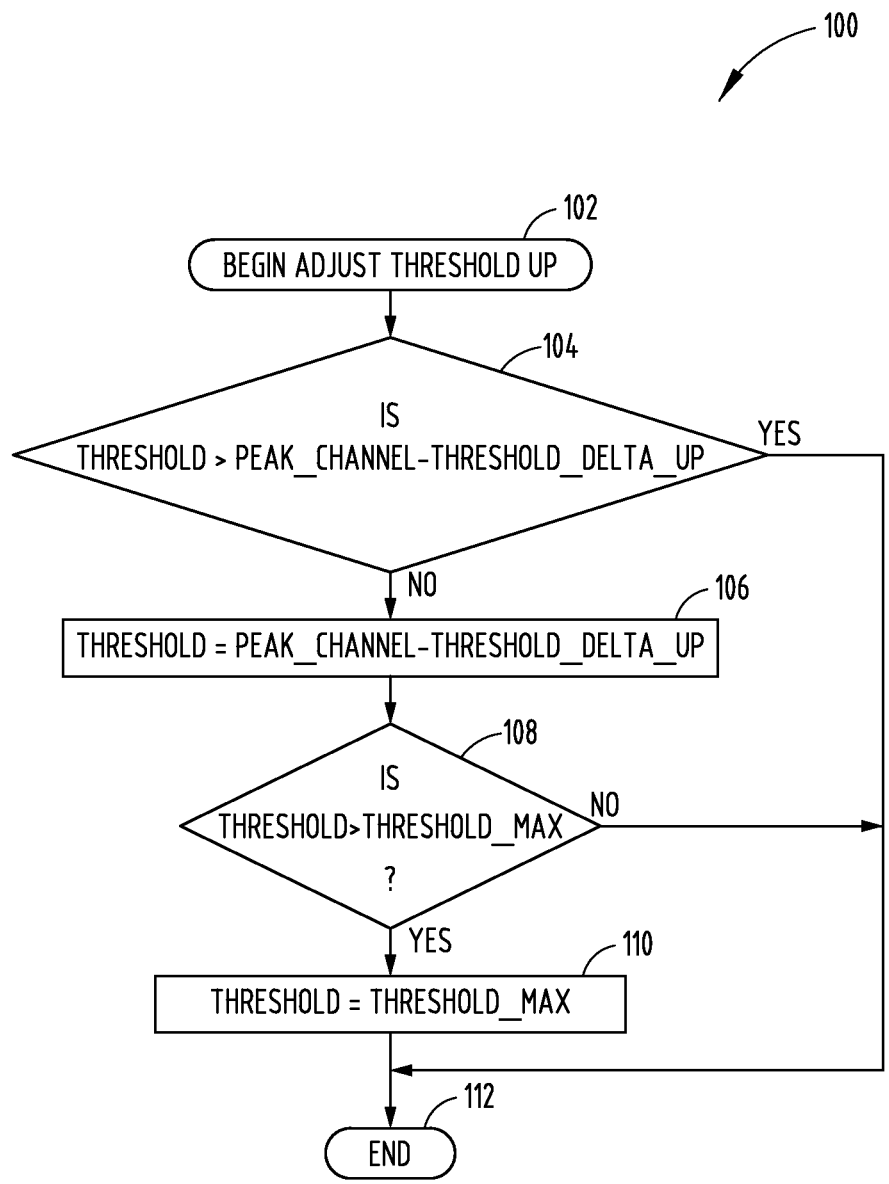
FIG. 11 is a flow diagram illustrating a routine for learning and increasing sensitivity of a capacitive switch, according to one embodiment.

Referring to FIG. 11, routine 100 is illustrated for adjusting the threshold up which decreases the sensitivity of the proximity switch assembly. Routine 100 begins at step 102 and proceeds to decision step 104 to determine if the threshold is greater than PEAK_CHANNEL minus THRESHOLD_DELTA_UP ($\Delta$ UP), and if the condition is not met, proceeds to step 106 to set the threshold equal to PEAK_CHANNEL minus THRESHOLD_DELTA_UP. DELTA_UP ($\Delta$ UP) serves as hysteresis to prevent repeatedly entering and exiting the glove mode. Next, at decision step 108, if the threshold is greater than THRESHOLD_MAX, then routine 100 proceeds to step 110 to set the threshold equal to the THRESHOLD_MAX. Thus, the threshold is limited at the uppermost value to THRESHOLD_MAX. Routine 100 then ends at step 112. Accordingly, routine 100 automatically adjusts the threshold value up to decrease sensitivity when a high $\Delta$ sensor count signal is detected while a finger interacts with one or more of the switches, indicative that the finger has a high sensitivity to interact with the switch sensors such as occurs when the finger is not covered by a glove. The change in sensitivity occurs automatically during use of the proximity switch assembly.

Figure 12:
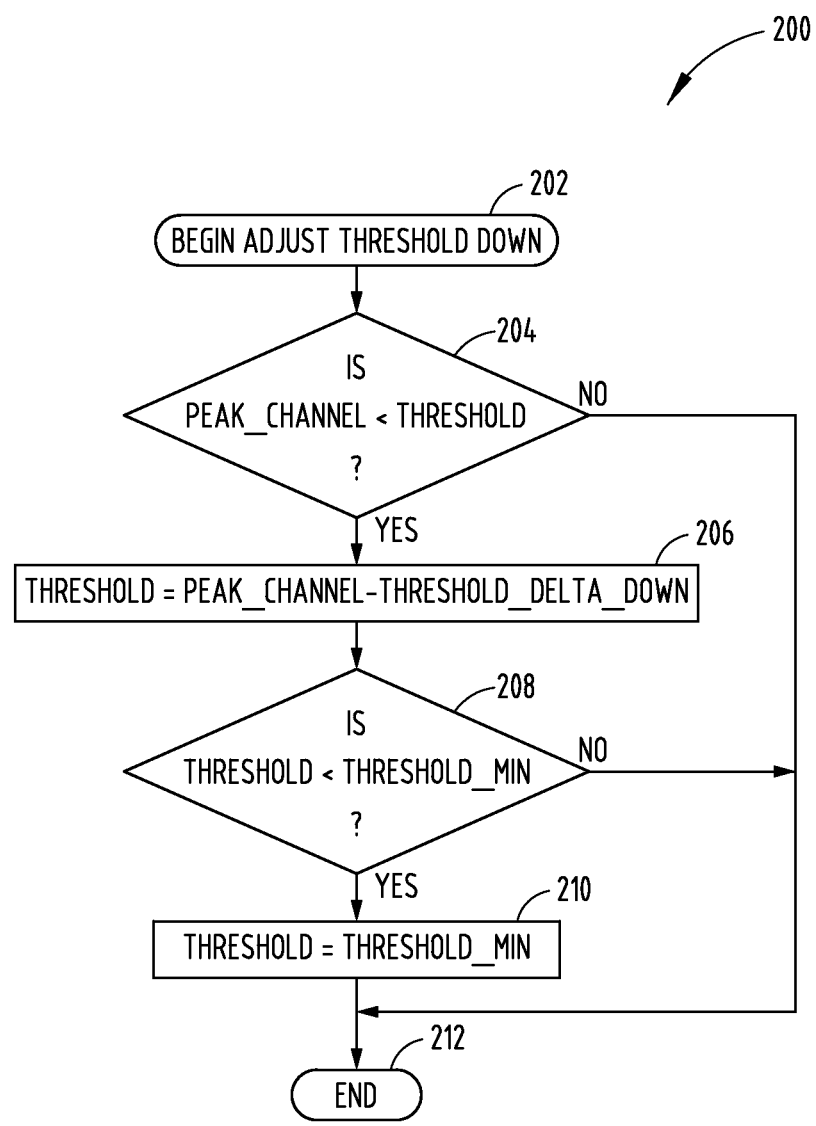
FIG. 12 is a flow diagram illustrating a routine for learning and decreasing sensitivity, according to one embodiment.

Referring to FIG. 12, routine 200 is illustrated for adjusting the sensitivity of the proximity switch assembly down so as to increase the sensitivity of the switches. Routine 200 begins at step 202 and proceeds to decision step 204 to determine if the PEAK_CHANNEL is less than the THRESHOLD and, if so, sets the THRESHOLD equal to PEAK_CHANNEL minus THRESHOLD_DELTA_DOWN ($\Delta$ DOWN) at step 206. The DELTA_DOWN ($\Delta$ DOWN) serves as hysteresis to prevent the proximity switch assembly for entering and exiting the non-glove mode. In this mode, the glove is detected when a stable and clean signal for a sufficient time period below the current threshold is detected. When this occurs, the THRESHOLD is lowered by subtracting $\Delta$ DOWN from the PEAK_CHANNEL signal. Routine 200 also proceeds to decision step 208 to determine if the THRESHOLD is less than THRESHOLD_MIN and, if so, proceeds to step 210 to set the THRESHOLD equal to the THRESHOLD_MIN. Thus, the THRESHOLD cannot be adjusted below THRESHOLD_MIN. Routine 200 then ends at step 212. Accordingly, the proximity switch assembly and method detects when a low sensitivity finger, such as a gloved finger, is interacting with one of the switches by detecting a stable signal for a sufficient period of time and automatically adjusts the sensitivity by decreasing the THRESHOLD to increase the sensitivity to allow use of the proximity switch assembly with the gloved finger.

Activation of a switch may be determined by detecting when an activated switch is released by the user's button. Comparisons are made to see how much the measured activation peak signal is greater than or less than the current THRESHOLD. If the difference is greater than THRESHOLD_DELTA_UP, which provides hysteresis, then the THRESHOLD is increased by the $\Delta$ UP value. On the other hand, when a long stable and clean signal below the current THRESHOLD is detected, a check is made to see how much the measured activation peak is below the current THRESHOLD. The current THRESHOLD is lowered by the difference plus an additional $\Delta$ DOWN, which reduces the frequency of training. In other words, when a glove is detected, the THRESHOLD is lowered just enough that any other button pressed with the same finger wearing a glove should be triggered. When a press of a finger is detected that generates a value larger than the current THRESHOLD, it is reasonable to assume that the gloves are off or in the case of multilayer gloves, that one layer is removed, and the threshold may thus be automatically increased to allow continued use of the proximity switches. The parameter Δ DOWN is used to make enough room at the bottom so that only one or at most two switch button presses are needed to learn and adapt the specific glove. The parameter THRESHOLD Δ UP is used to prevent button presses of slightly different intensity to trigger the glove mode on and off.

Figure 13:
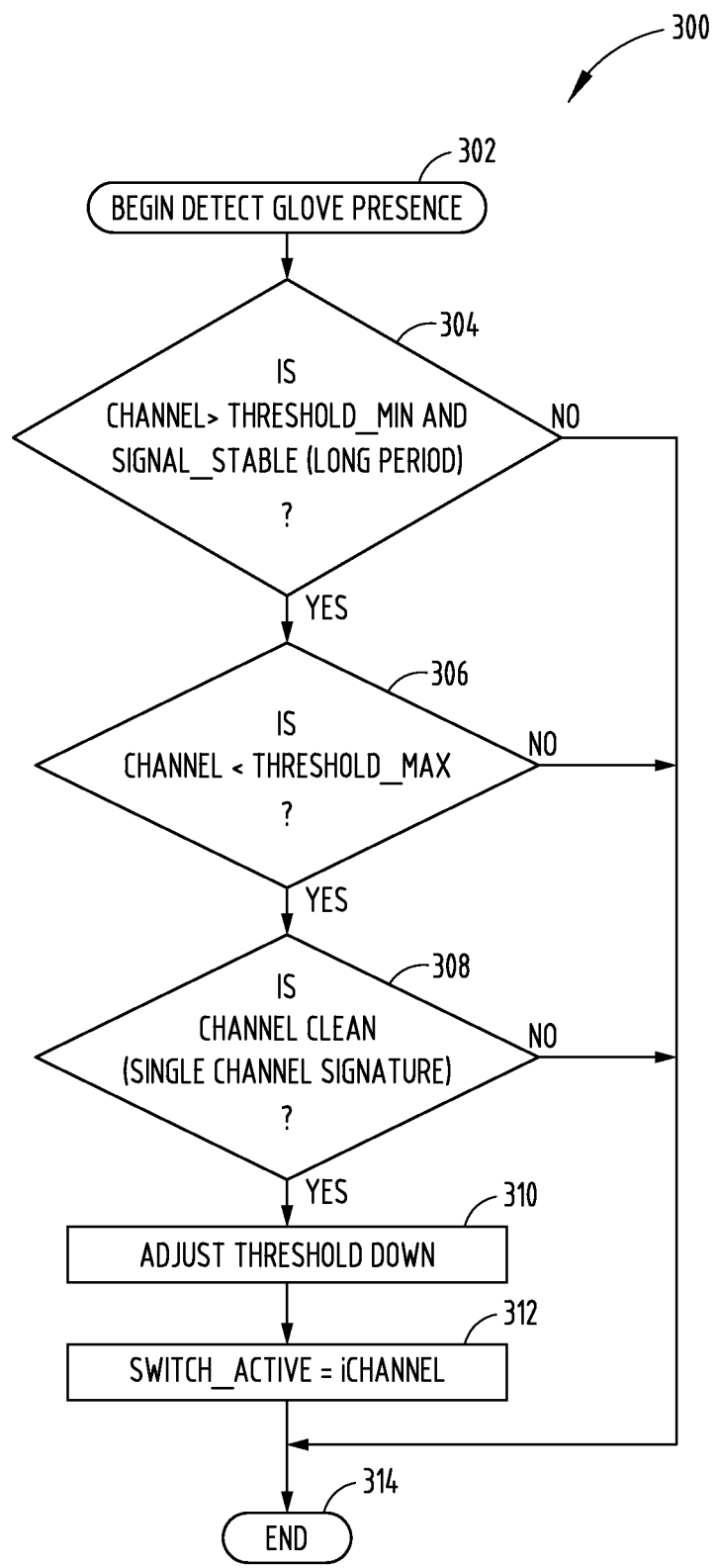
FIG. 13 is a flow diagram illustrating a routine for decreasing the sensitivity when a glove is detected, according to one embodiment.
Figure 14:
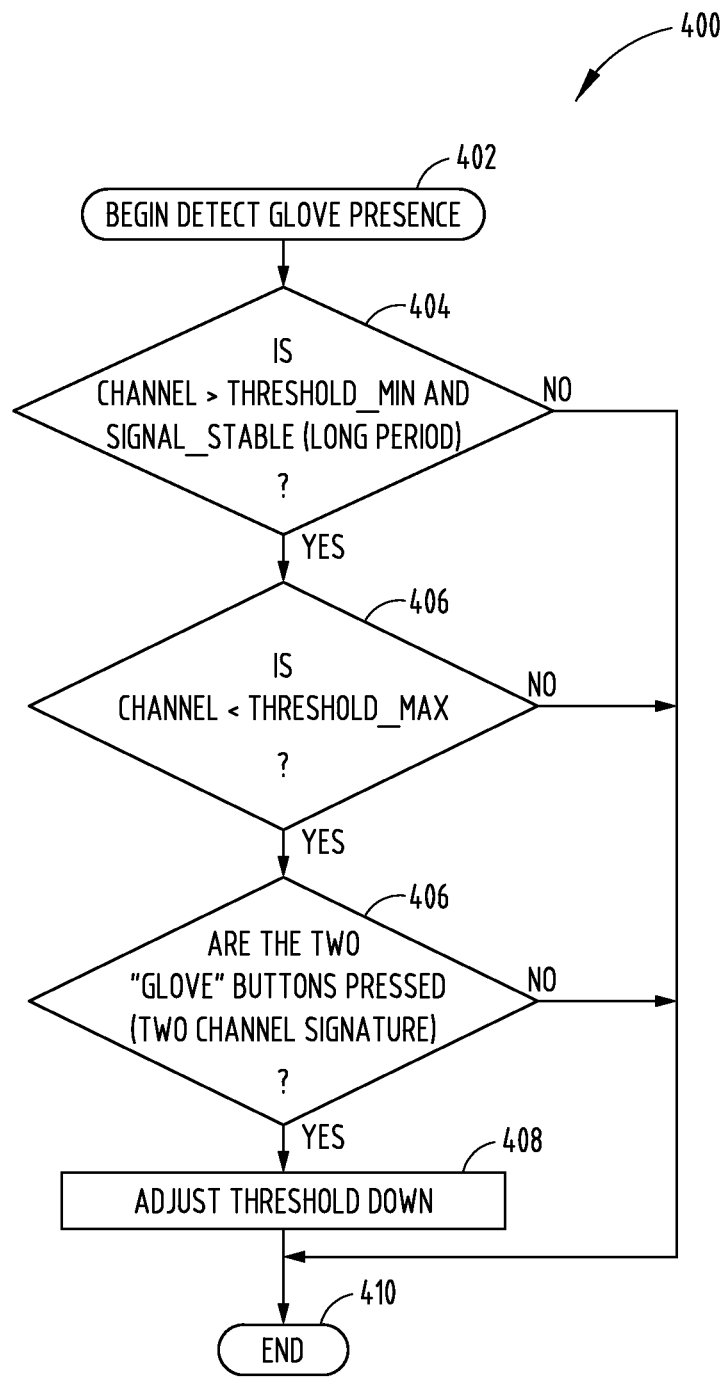
FIG. 14 is a flow diagram illustrating a routine for decreasing sensitivity when a glove is detected, according to another embodiment.

The glove on mode may be implemented with a single button glove interaction learning method according to one embodiment, or a two-button glove interaction learning method according to a second embodiment. The single button glove interaction learning method 300 is shown in FIG. 13, according to the first embodiment and the two-button glove interaction method 400 is shown in FIG. 14. As the vehicle starts, the proximity switch assembly may be set in the glove off mode as a default setting. If the occupant (user) is wearing glove(s) and attempts to use one or more of the proximity switches, the first touch or interaction will require a longer activation time to allow for detection of the reduced signal due to the glove to automatically adjust the sensitivity to allow for use in the glove mode. Once the user removes the glove and interacts with one or more of the proximity switches with one or more bare fingers, a higher intensity level is detected and the proximity switch assembly automatically readjusts to the glove off mode.

Referring to FIG. 13, the single button glove interaction learning method 300 begins at step 302 and proceeds to decision step 304 to determine if the signal channel associated with a switch is greater than the THRESHOLD_MIN and the signal is stable for a sufficiently long period of time, such as 1.0 second. If the signal channel exceeds the THRESHOLD_MIN and the signal is stable for a sufficiently long period of time, then method 300 proceeds to decision step 306 to determine if the signal channel is less than the THRESHOLD_MAX and, if so, proceeds to decision step 308 to determine if the signal channel is clean pursuant to a single channel signature. If the conditions in decision steps 304, 306 and 308 are yes, method 300 proceeds to step 310 to adjust the THRESHOLD_DOWN and to step 312 to set the SWITCH_ACTIVE equal to iCHANNEL which is the current channel, prior to ending at step 314. The step of adjusting the THRESHOLD_DOWN may be adjusted pursuant to routine 100 shown in FIG. 11.

Referring to FIG. 14, the two-button gloved interaction learning method 400 begins at step 402. With this method, when a user wearing gloves wishes to operate the proximity switch assembly while wearing gloves, the user will need to actively select the glove-on mode by gently pressing two specific adjacent switches (buttons), for a sufficient time interval, such as 0.5 to 1.0 seconds. The two designated switches may be labeled to inform the user of the two button sensitivity control. In decision step 404, method 400 checks for whether the signal channel is greater than the THRESHOLD_MIN and that the signal is stable for a sufficiently long period of time and, if so, proceeds to decision step 406 to determine if the signal channel is less than the THRESHOLD_MAX. If the condition set forth in steps 404 and 406 are met, method 400 proceeds to decision step 406 to determine if the two buttons are pressed by processing the two signal channel signatures associated with the two buttons. If the two buttons are simultaneously pressed as required, method 400 proceeds to adjust the THRESHOLD DOWN at step 408 before ending at step 410. The THRESHOLD can be adjusted down pursuant to routine 200 illustrated in FIG. 12. According to this method, a confirmation of entering the glove mode may be provided to a user, such as a tactile, audio or a flickering of the dome lamp to let the user know that the glove mode has been set. Thereafter, the presence of the learned glove, and the sensitivity parameters are adjusted. When the user removes the glove from the finger and reengages one or more switches, the higher intensity level is detected and the proximity switch assembly automatically readjusts the sensitivity to the glove off mode.

Figure 15:
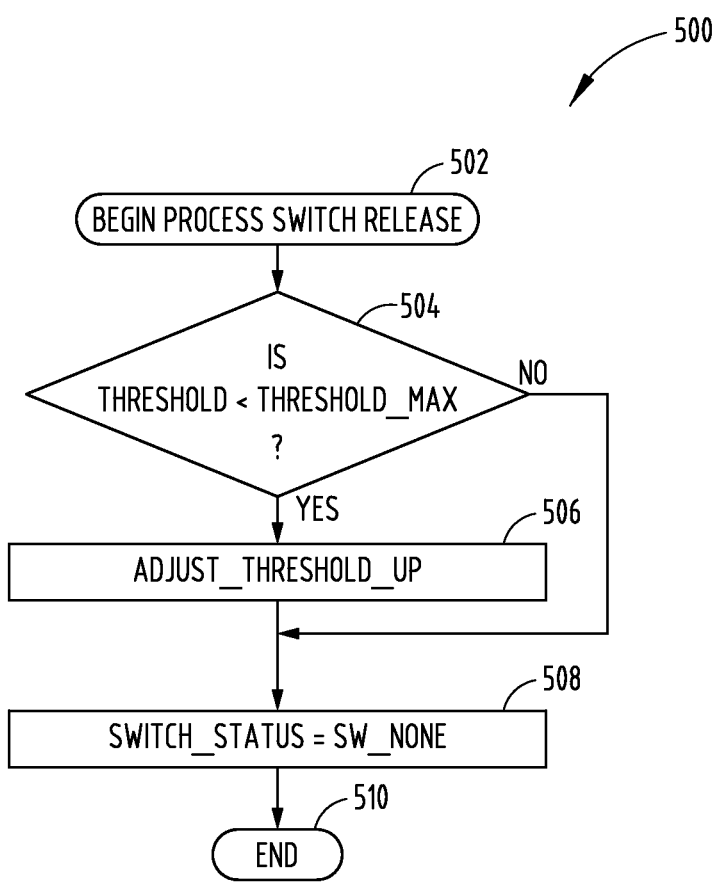
FIG. 15 is a flow diagram illustrating a routine for adjusting the sensitivity threshold up, according to one embodiment.

A process switch release method 500 is illustrated in FIG. 15 beginning at step 502 and proceeding to decision step 504 to determine if the THRESHOLD is less than the THRESHOLD_MAX. If the THRESHOLD is less than THRESHOLD_MAX, method 500 proceeds to adjust the THRESHOLD_UP at step 506. Thereafter, at step 508, the SWITCH_STATUS is set equal to SWITCH_NONE, indicative of no activation of the switch, before ending at step 510.

Accordingly, the proximity switch arrangement advantageously provides for learned user adjustment of the sensitivity of proximity switches 22 provided onboard a vehicle 10. By learning and adjusting the sensitivity of the proximity switches 22 via the learned sensitivity, an enhanced sensitivity of the detection of an activating finger may be realized to accommodate for the user of a glove worn over the user's finger. Additionally, changes to sensitivity may accommodate other variations in the activation by a user, such as different length fingers, differing lengths of user fingernails which may cause the finger to be more distant from the sensor, or a particular swipe motion technique used by the user.

It is to be understood that variations and modifications can be made on the aforementioned structure without departing from the concepts of the present invention, and further it is to be understood that such concepts are intended to be covered by the following claims unless these claims by their language expressly state otherwise.

We claim:

1. A proximity switch having sensitivity control comprising:
   a proximity sensor providing a sense activation field and generating a signal; and
   control circuitry detecting activation of the proximity switch based on the signal compared to a threshold and adjusting the threshold to control sensitivity, wherein the threshold is decreased when the signal is less than the threshold for a minimum time period, and is increased when a peak value of the signal exceeds the threshold by a predetermined value.

2. The proximity switch of claim 1, wherein the threshold is decreased when the signal is substantially stable for the minimum time period.

3. The proximity switch of claim 2, wherein the minimum time period is at least 0.5 seconds.

4. The proximity switch of claim 2, wherein the substantially stable signal is the signal having an amplitude at a substantially constant value.

5. The proximity switch of claim 1, wherein the threshold is limited to a range defined by a maximum threshold and a minimum threshold.

6. The proximity switch of claim 1, wherein the control circuitry further comprises detecting two switches activated simultaneously prior to decreasing the threshold.

7. The proximity switch of claim 1, wherein the control circuitry performs a learning routine upon activation of the sensor to learn the sensitivity depending on use of a glove and adjusts the threshold based on the learned sensitivity.

8. The proximity switch of claim 1, wherein the proximity switch is installed in a vehicle for use by a hand of a passenger in the vehicle.

9. The proximity switch of claim 1, wherein the proximity switch comprises a capacitive sensor.

10. A vehicle capacitive switch having sensitivity control comprising:
   a capacitive sensor installed in a vehicle providing a sense activation field and generating a signal; and
   control circuitry detecting activation of the proximity switch based on the signal compared to a threshold and adjusting the threshold to control sensitivity, wherein the threshold is decreased when the signal is substantially stable and less than the threshold for a minimum time period, and is increased when a peak value of the signal exceeds the threshold by a predetermined value.

11. A method of sensing user proximity, said method comprising:
   generating a sense activation field with a proximity sensor;
   generating a signal with the proximity sensor in response to user interaction;
   detecting activation of the proximity switch by comparing the signal to a threshold;
   decreasing the threshold when the signal is detected substantially stable and below the threshold for a minimum time period; and
   increasing the threshold when the signal exceeds the threshold by a predetermined value.

12. The method of claim 11 further comprising the step of detecting a substantially stable signal below the threshold for a minimum time period, wherein the threshold is decreased when the substantially stable signal is below the threshold for the minimum time period.

13. The method of claim 12, wherein the minimum time period is at least 0.5 seconds.

14. The method of claim 12, wherein the substantially stable signal is the signal having an amplitude at a substantially constant value.

15. The method of claim 11, wherein the threshold is adjusted within a range defined by a maximum threshold and a minimum threshold.

16. The method of claim 11 further comprising the step of detecting simultaneous activation of two switches and adjusting the threshold down when the two switches are simultaneously activated.

17. The method of claim 11, wherein the proximity sensor is installed in a vehicle for use by a hand of a passenger in the vehicle.

18. The method of claim 11, wherein the proximity sensor comprises a capacitive sensor.

19. The method of claim 11 further comprising a step of outputting a control signal based on the comparison to control a device.

20. The method of claim 11, wherein the step of increasing the threshold occurs when a peak value of the signal exceeds the threshold by the predetermined value.

* * * * *